United States Patent
Nada et al.

(10) Patent No.: US 10,620,064 B2
(45) Date of Patent: Apr. 14, 2020

(54) PRESSURE SENSOR

(71) Applicant: Nissha Co., Ltd., Kyoto-shi, Kyoto (JP)

(72) Inventors: Hideaki Nada, Kyoto (JP); Jumpei Morita, Kyoto (JP)

(73) Assignee: NISSHA CO., LTD., Kyoto-Shi, Kyoto (JP)

( * ) Notice: Subject to any disclaimer, the term of this patent is extended or adjusted under 35 U.S.C. 154(b) by 0 days.

(21) Appl. No.: 16/331,465

(22) PCT Filed: Aug. 24, 2017

(86) PCT No.: PCT/JP2017/030396
§ 371 (c)(1),
(2) Date: Mar. 7, 2019

(87) PCT Pub. No.: WO2018/051760
PCT Pub. Date: Mar. 22, 2018

(65) Prior Publication Data
US 2019/0219462 A1    Jul. 18, 2019

(30) Foreign Application Priority Data
Sep. 16, 2016 (JP) .................. 2016-182347

(51) Int. Cl.
*G01L 1/00* (2006.01)
*G01L 1/20* (2006.01)
(Continued)

(52) U.S. Cl.
CPC ............ *G01L 1/205* (2013.01); *G01L 5/00* (2013.01); *H01L 27/00* (2013.01); *H01L 27/3241* (2013.01); *H01L 27/3246* (2013.01)

(58) Field of Classification Search
CPC . H01L 27/3246; H01L 27/3241; G01L 1/205; G01L 5/00
(Continued)

(56) References Cited

U.S. PATENT DOCUMENTS 6,057,647 A * 5/2000 Kurosawa ............ G09G 3/3233
313/257
7,446,338 B2 * 11/2008 Shirasaki ............ H01L 27/3279
257/72
(Continued)

FOREIGN PATENT DOCUMENTS

DE    112013004512 T5    6/2015
EP       2015223 A2       1/2009
(Continued)

OTHER PUBLICATIONS

International Search Report for International Application No. PCT/JP2017/030396, dated Sep. 26, 2017, 2 pp.

*Primary Examiner* — Max H Noori
(74) *Attorney, Agent, or Firm* — United IP Counselors, LLC

(57) ABSTRACT

A pressure sensor is disclosed. The pressure sensor includes a common electrode, a plurality of individual electrodes, a plurality of thin-film transistors and a common pressure-sensitive layer. The common electrode is formed as a layer. The plurality of individual electrodes are arranged in a matrix opposing the common electrode. The plurality of thin-film transistors are respectively located corresponding to the individual electrodes on sides of the individual electrodes opposite to the common electrode, where one or two or more adjacent thin-film transistors are connected to one individual electrode. The common pressure-sensitive layer is disposed on a surface of the common electrode on a side facing the plurality of individual electrodes. The plurality of individual electrodes include a first electrode, and a second electrode that is thicker than the first electrode and therefore creates a smaller gap from the common pressure-sensitive layer than the first electrode.

16 Claims, 19 Drawing Sheets

(51) Int. Cl.
  *G01L 5/00* (2006.01)
  *H01L 27/32* (2006.01)
  *H01L 27/00* (2006.01)

(58) Field of Classification Search
  USPC .................................................. 73/862.68
  See application file for complete search history.

(56) References Cited

U.S. PATENT DOCUMENTS

| | | | |
|---|---|---|---|
| 8,803,415 B2* | 8/2014 | Lee ..................... | H01L 51/5259 |
| | | | 313/501 |
| 2006/0066219 A1* | 3/2006 | Shimoda ............. | H01L 27/3244 |
| | | | 313/500 |
| 2009/0027352 A1 | 1/2009 | Abele | |
| 2012/0162109 A1* | 6/2012 | Sasaki ................... | G06F 3/0412 |
| | | | 345/173 |
| 2014/0076063 A1 | 3/2014 | Lisseman et al. | |

FOREIGN PATENT DOCUMENTS

| | | |
|---|---|---|
| FR | 2918747 A1 | 1/2009 |
| JP | 2013-068563 A | 4/2013 |
| JP | 2014-035227 A | 2/2014 |
| JP | 2015-531877 A | 11/2015 |
| JP | 2016-004940 A | 1/2016 |
| WO | 2014/043664 A1 | 3/2014 |

* cited by examiner

| Z | X | Y | Z | X | Y | Z | X | Y |
|---|---|---|---|---|---|---|---|---|
| Y | Z | X | Y | Z | X | Y | Z | X |
| X | Y | Z | X | Y | Z | X | Y | Z |
| Z | X | Y | Z | X | Y | Z | X | Y |
| Y | Z | X | Y | Z | X | Y | Z | X |
| X | Y | Z | X | Y | Z | X | Y | Z |

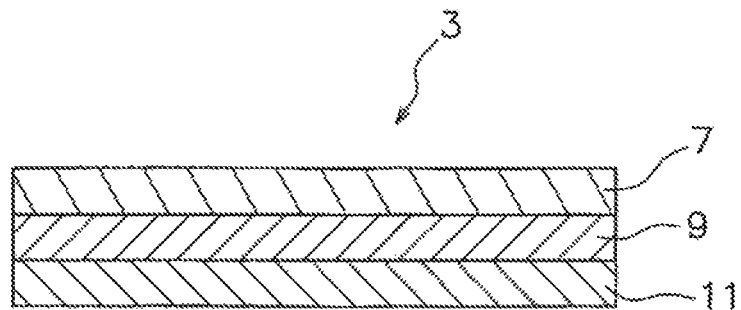
FIG. 23
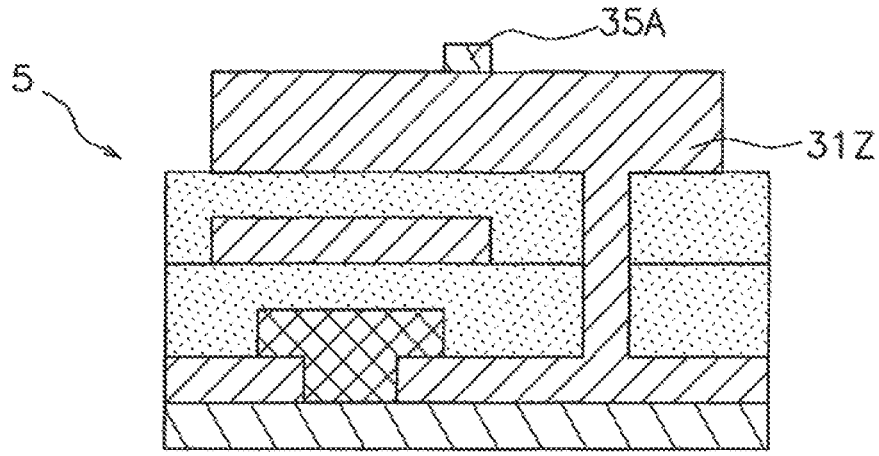
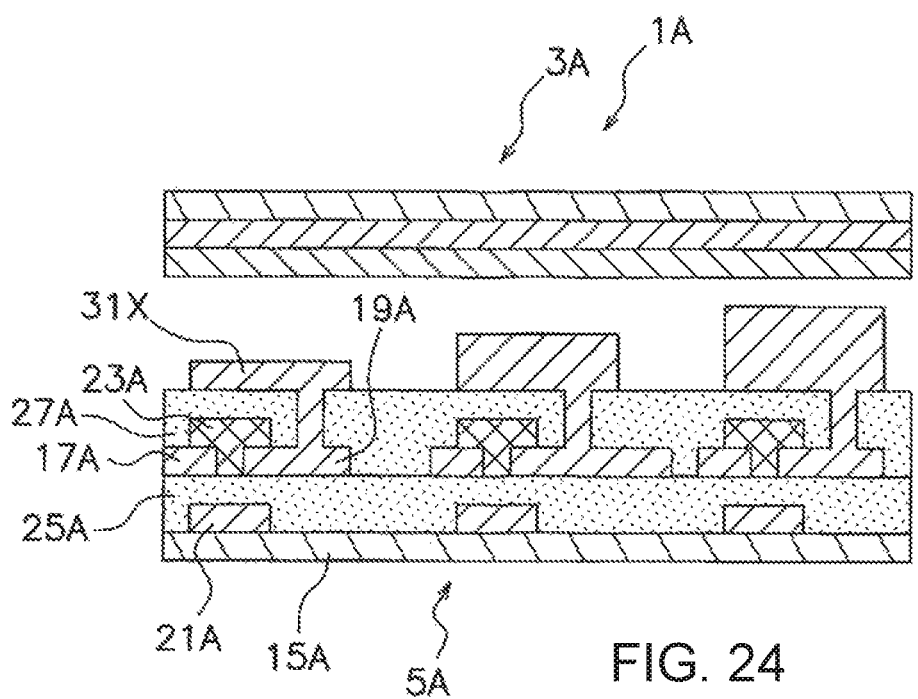
FIG. 24

PRESSURE SENSOR

CROSS-REFERENCE TO RELATED APPLICATIONS

This application is the U.S. National Phase of PCT International Application No. PCT/JP2017/030396, filed on Aug. 24, 2017. That application claims priority to Japanese Patent Application No. 2016-182347, filed Sep. 16, 2016. The contents of that application are incorporated by reference herein in their entirety.

TECHNICAL FIELD

The present disclosure relates to a pressure sensor, more particularly to a pressure sensor that includes a pressure-sensitive layer and a plurality of thin-film transistors that function as electrodes.

BACKGROUND ART

There is known a pressure sensor that is formed through combining a plurality of thin-film transistors and a pressure-sensitive resin (see, for example, Japanese Patent Unexamined Publication 2016-4940).

The pressure-sensitive resin is a resin formed by dispersing conductive particles in an insulating resin such as silicon rubber. When pressure is applied to the pressure-sensitive resin, conductive particles in the insulating resin make contact with each other and hence the resistance value of the pressure-sensitive resin reduces. As a result, it is possible to detect pressure that is applied to the pressure-sensitive resin.

The plurality of thin-film transistors are arranged in a matrix and function as electrodes. With this configuration, pressure can be detected at higher speed and higher resolution and power can be saved.

BRIEF SUMMARY

There is also known a pressure sensor in which a pressure-sensitive layer and a plurality of electrodes are arranged facing each other with a predetermined gap between the pressure-sensitive layer and the electrodes.

Generally speaking, pressure-sensitive layers in pressure sensors have small ranges for measuring pressures, which is a problem. More specifically, pressure-electricity resistance characteristics undergo a large rate of change in electrical resistance in a low-pressure range and a low rate of change in electrical resistance in a high-pressure range. This is because, even if pressure increases, the area of contact between the pressure-sensitive layer and the electrodes does not increase partway through contact. In other words, contact resistance is not responsive to pressure. As a result, in a range where there is a large amount of pressure, sensitivity is insufficient and pressure cannot be accurately measured.

It is an object of the present disclosure to provide a pressure detection sensor that includes electrodes that are arranged with gaps between the electrodes and has a larger pressure measurement range in which pressure can be accurately measured.

Means for solving the problem of the disclosure are described below in the form of aspects. The below aspects may be freely combined as required.

A pressure sensor according to one aspect of the present disclosure includes a common electrode, a plurality of individual electrodes, a plurality of thin-film transistors and a common pressure-sensitive layer.

The common electrode is spread out over one surface.

The plurality of individual electrodes are arranged in a matrix facing the common electrode.

The plurality of thin-film transistors are respectively located corresponding to the plurality of individual electrodes on sides of the individual electrodes opposite to the common electrode, where one or two or more adjacent thin-film transistors are connected to one individual electrode.

The common pressure-sensitive layer is disposed on a surface of the common electrode on a side facing the plurality of individual electrodes.

The plurality of individual electrodes include a first electrode, and a second electrode that is thicker than the first electrode and therefore creates a smaller gap from the common pressure-sensitive layer than the first electrode.

In this pressure sensor, when pressure is low, only the second electrode makes contact with the common pressure-sensitive layer. As a result, a change in resistance (that is, pressure) of the common pressure-sensitive layer can be accurately measured via the second electrode. When pressure is high, the common pressure-sensitive layer makes contact with both the second electrode and the first electrode. As a result, a change in resistance (that is, pressure) of the common pressure-sensitive layer can be accurately measured via the first electrode. This is because the gap between the first electrode and the common pressure-sensitive layer is long and a pressure measurement range in which electrical resistance can be accurately measured has shifted to a higher pressure side than that of the second electrode. In other words, the pressure measurement range corresponds to high pressure.

The pressure sensor may have a region subject to pressing where the first electrode and the second electrode may be arranged in a row so as to be within a minimum pressing force area, regardless of which position of the region is pressed. The term "minimum pressing force area" refers to a lower limit area assumed to always be pressed when a predetermined pushing object (for example, a finger or a pen) presses the pressure sensor.

In this pressure sensor, low pressure can be accurately measured with the second electrode and high pressure can be accurately measured with the first electrode, regardless of which position of the region is pressed.

The pressure sensor may further include a spacer that is formed on a surface of the common electrode on a side that faces the plurality of the individual electrodes to be opposed to the plurality of the individual electrodes.

The pressure sensor may further include spacers that are formed on surfaces of the plurality of individual electrodes on sides that face the common electrode, and that oppose the common electrode.

A pressure sensor according to another aspect of the present disclosure includes a common electrode, a plurality of individual electrodes, a plurality of thin-film transistors, a first individual pressure-sensitive layer and a second individual pressure-sensitive layer.

The common electrode is spread out over one surface.

The plurality of individual electrodes are arranged in a matrix facing the common electrode.

The plurality of thin-film transistors are respectively located corresponding to the plurality of individual electrodes on sides of the individual electrodes opposite to the common electrode, where one or two or more adjacent thin-film transistors are connected to one individual electrode.

The first individual pressure-sensitive layer is disposed on a first electrode among the plurality of the individual electrodes on a side facing the common electrode.

The second individual pressure-sensitive layer is disposed on a second electrode among the plurality of the individual electrodes on a side facing the common electrode.

The gap between the second individual pressure-sensitive layer and the common electrode is shorter than the gap between the first individual pressure-sensitive layer and the common electrode In this pressure sensor, when pressure is low, only the second individual pressure-sensitive layer makes contact with the common electrode. As a result, a change in resistance (that is, pressure) of the second individual pressure-sensitive layer can be accurately measured via the second electrode. When pressure is high, the common electrode makes contact with both the second individual pressure-sensitive layer and the first individual pressure-sensitive layer. As a result, a change in resistance (that is, pressure) of the first individual pressure-sensitive layer can be accurately measured via the first electrode. This is because the gap between the first individual pressure-sensitive layer and the common electrode is long and a pressure measurement range in which electrical resistance can be accurately measured has shifted to a higher pressure side than that of the second individual pressure-sensitive layer. In other words, the pressure measurement range corresponds to high pressure.

The second electrode may be thicket than the first electrode.

The second individual pressure-sensitive layer may be thicker than the first individual pressure-sensitive layer.

The pressure sensor may include a region subject to pressing where the first individual pressure-sensitive layer and the second individual pressure-sensitive layer may be arranged in a row so as to be within a minimum pressing force area, regardless of which position of the region is pressed.

The pressure sensor may further include a spacer that is formed on a surface of the common electrode on a side that faces the plurality of the individual electrodes to be opposed to the plurality of the individual electrodes.

The pressure sensor may further include spacers that are formed on surfaces of the plurality of individual electrodes on sides that face the common electrode, and that oppose the common electrode.

A pressure sensor according to another aspect of the present disclosure includes a common electrode, a plurality of individual electrodes, a plurality of thin-film transistors, a common pressure-sensitive layer, a first individual pressure-sensitive layer and a second individual pressure-sensitive layer.

The common electrode is spread out over one surface.

The plurality of individual electrodes are arranged in a matrix facing the common electrode.

The plurality of thin-film transistors are respectively located corresponding to the plurality of individual electrodes on sides of the individual electrodes opposite to the common electrode, where one or two or more adjacent thin-film transistors are connected to one individual electrode.

The common pressure-sensitive layer is disposed on a surface of the common electrode on a side facing the plurality of individual electrodes.

The first individual pressure-sensitive layer is disposed on a first electrode among the plurality of the individual electrodes on a side facing the common electrode.

The second individual pressure-sensitive layer is disposed on a second electrode among the plurality of the individual electrodes on a side facing the common electrode.

The gap between the second individual pressure-sensitive layer and the common pressure-sensitive layer is shorter than the gap between the first individual pressure-sensitive layer and the common pressure-sensitive layer.

In this pressure sensor, when pressure is low, only the second individual pressure-sensitive layer makes contact with the common pressure-sensitive layer. As a result, a change in resistance (that is, pressure) of common pressure-sensitive layer and the second individual pressure-sensitive layer can be accurately measured via the second electrode. When pressure is high, the common pressure-sensitive layer makes contact with both the second individual pressure-sensitive layer and the first individual pressure-sensitive layer. As a result, a change in resistance (that is, pressure) of the common pressure-sensitive layer and the first individual pressure-sensitive layer can be accurately measured via the first electrode. This is because the gap between the first individual pressure-sensitive layer and the common pressure-sensitive layer is long and a pressure measurement range in which electrical resistance can be accurately measured has shifted to a higher pressure side than that of the second individual pressure-sensitive layer. In other words, the pressure measurement range corresponds to high pressure.

The second electrode may be thicker than the first electrode.

The second individual pressure-sensitive layer may be thicker than the first individual pressure-sensitive layer.

The pressure sensor may include a region subject to pressing where the first individual pressure-sensitive layer and the second individual pressure-sensitive layer may be arranged in a row so as to be within a minimum pressing force area, regardless of which position of the region is pressed.

The pressure sensor may further include a spacer that is formed on a surface of the common pressure-sensitive layer on a side that faces the first individual pressure-sensitive layer and the second individual pressure-sensitive layer, and that opposes the first individual pressure-sensitive layer and the second individual pressure-sensitive layer.

The pressure sensor may further include spacers that are formed on surfaces of the first individual pressure-sensitive layer and the second individual pressure-sensitive layer on sides that face the common pressure-sensitive layer, and that oppose the common pressure-sensitive layer.

The pressure detection sensor according to the present disclosure has a larger pressure measurement range in which pressure can be accurately measured.

BRIEF DESCRIPTION OF THE DRAWINGS

FIG. 23 is a schematic cross-sectional view for illustrating a method for manufacturing the pressure sensor according to the second embodiment.

FIG. 24 is a partial schematic cross-sectional view for illustrating a pressure sensor according to a third embodiment.

FIG. 33 is a schematic plan view for illustrating arrangement of the individual electrodes according to an eleventh embodiment.

FIG. 34 is a schematic plan view for illustrating arrangement of the individual electrodes according to a twelfth embodiment.

DETAILED DESCRIPTION

1. First Embodiment (1) Basic Configuration of Pressure Sensor

Figure 1:
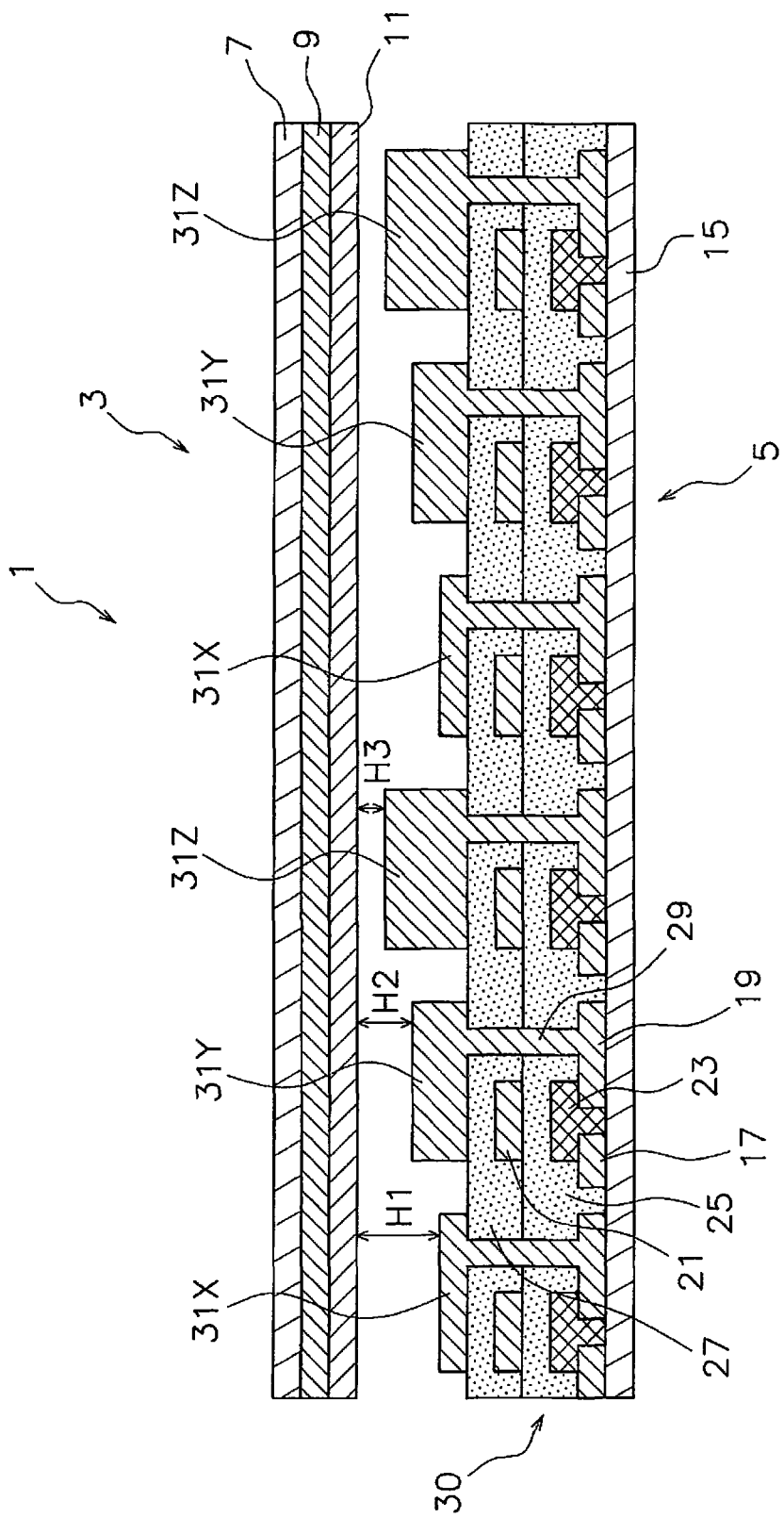
FIG. 1 is a schematic cross-sectional view of a pressure sensor according to a first embodiment of the present disclosure.
Figure 2:
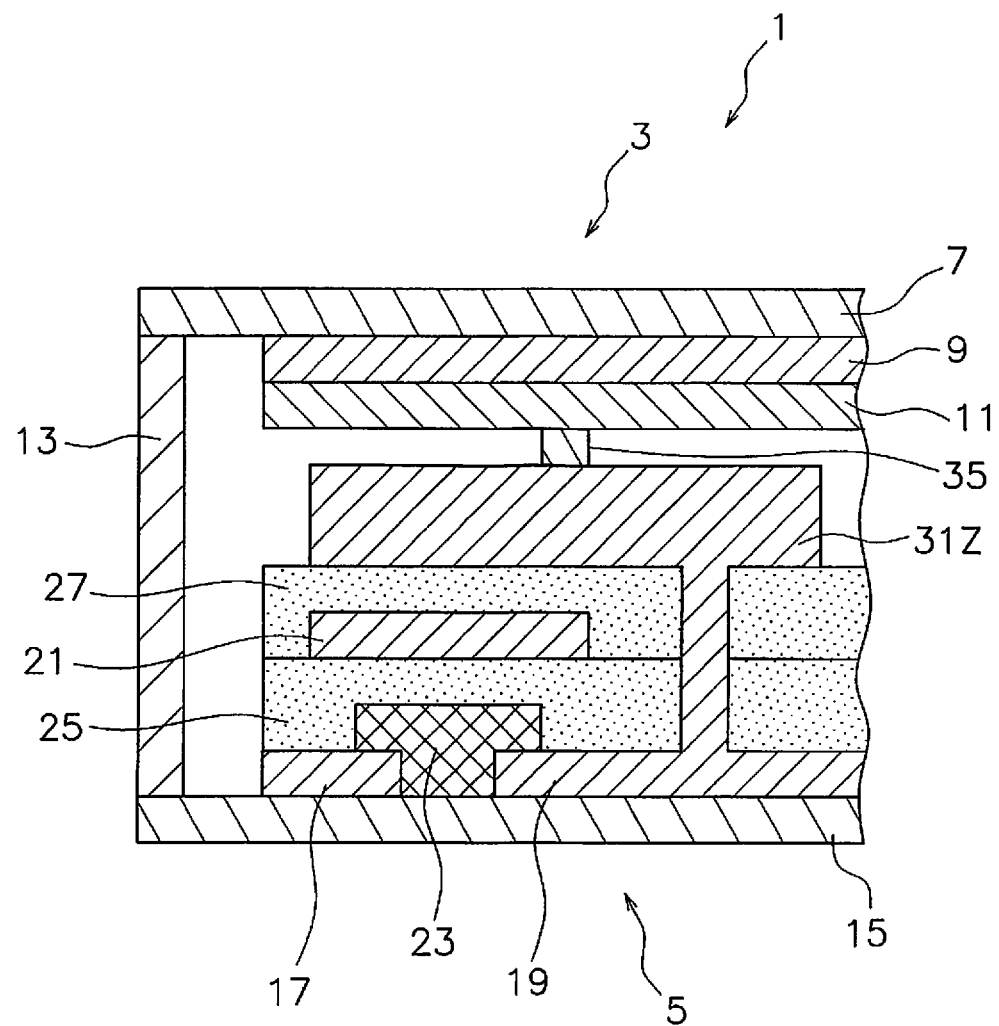
FIG. 2 is a partial schematic cross-sectional view of the pressure sensor.
Figure 3:
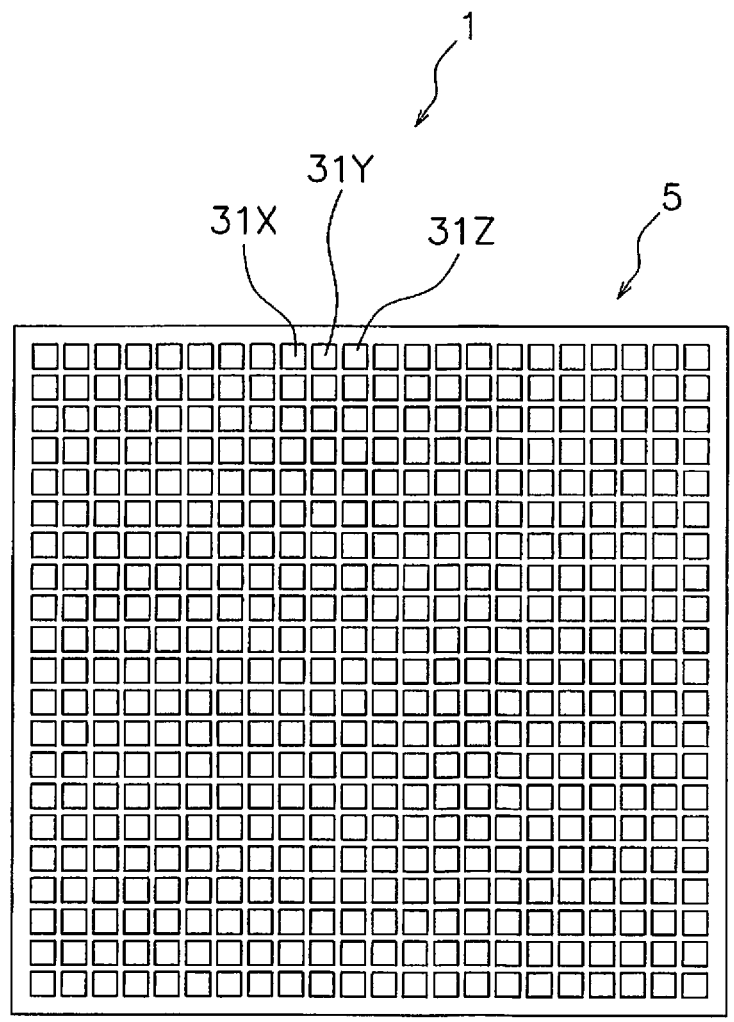
FIG. 3 is a schematic plan view of a lower electrode member of the pressure sensor.
Figures 4, 5:
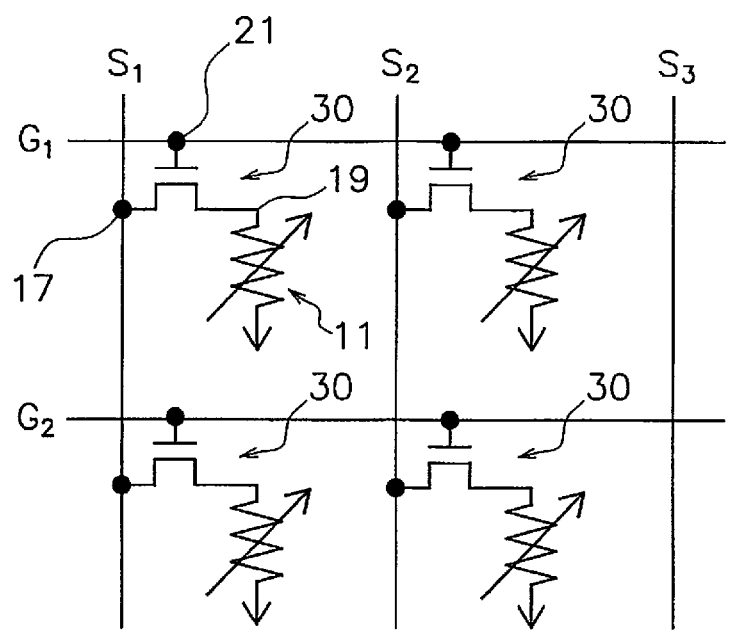
FIG. 4 is an equivalent circuit diagram of the pressure sensor.
FIG. 5 is a schematic plan view for illustrating arrangement of the individual electrodes.

A pressure sensor 1 according to a first embodiment is described with reference to FIGS. 1 to 4. FIG. 1 is a schematic cross-sectional view of the pressure sensor according to the first embodiment of the present disclosure. FIG. 2 is a partial schematic cross-sectional view of the pressure sensor. FIG. 3 is a schematic plan view of a lower electrode member of the pressure sensor. FIG. 4 is an equivalent circuit diagram of the pressure sensor.

The pressure sensor 1 is a device that detects a pressed position and pressing force when pressing force acts on the pressure sensor 1. The pressure sensor 1 is, for example, a touch panel display and is used in a smartphone, a tablet PC, or a note PC.

The pressure sensor 1 includes an upper electrode member 3. The upper electrode member 3 is a planar member on which pressing force acts. The upper electrode member 3 includes a, for example, rectangular insulating film 7, a common electrode 9 that is formed across the whole lower surface of the upper electrode member 3, that is, spread out across one surface of the upper electrode member 3, and a pressure-sensitive layer 11 (example of a common pressure-sensitive layer) that is formed on the entire lower surface of the common electrode 9.

The pressure sensor 1 includes a lower electrode member 5. The lower electrode member 5 is a planar member disposed below the upper electrode member 3. The lower electrode member 5 includes a, for example, rectangular insulating film 15 and a plurality of individual electrodes or pixel electrodes (31X to 31Y) that are formed on the insulating film 15.

As illustrated in FIG. 2, the upper electrode member 3 and the lower electrode member 5 are joined to each other at peripheral edges using a frame spacer 13. The frame spacer 13 is formed into a frame shape and is made of, for example, an adhesive or double-sided tape.

As illustrated in FIG. 3, the plurality of individual electrodes (31X to 31Y) are arrayed in a matrix. A "matrix" refers to a state where the plurality of electrodes are two-dimensionally arranged in rows and columns. As illustrated in FIGS. 1 and 2, the plurality of individual electrodes (31X to 31Y) oppose the common electrode 9 (in actuality, the pressure-sensitive layer 11) with a gap therebetween. When an area of the common electrode 9 is pushed down toward the individual electrodes 31X to 31Y, the common electrode 9 and the individual electrodes positioned in the pushed down area are electrically conducive with each other. The common electrode 9 may be pushed down using a finger, a stylus pen or a stick. The pitch between electrodes is, for example, between 0.3 mm to 0.7 mm.

The lower electrode member 5 includes a plurality of thin-film transistors 30 (hereinafter referred to as "TFT 30"). One TFT 30 is located for each individual electrode 31X to 31Z. Each TFT 30 functions as an electrode for detecting a current value.

(2) Relationship Between TFT and Individual Electrodes

As illustrated in FIGS. 1 and 2, the TFT 30 includes a source electrode 17, a drain electrode 19 and a gate electrode 21. The TFT 30 is a top gate transistor. The materials used to form the gate electrode, the source electrode and the drain electrode are not particularly limited.

The source electrode 17 and the drain electrode 19 are formed on an upper surface of the insulation film 15. The TFT 30 includes an organic semiconductor 23 that is formed between the source electrode 17 and the drain electrode 19. The material used to form the semiconductor layer may be a known material such as silicon, an oxide semiconductor, or an organic semiconductor.

The TFT 30 includes a first insulation film 25 formed so as to surround the source electrode 17, the drain electrode 19 and the organic semiconductor 23.

As described later, the drain electrode 19 is connected to the individual electrodes 31X to 31Y.

The gate electrode 21 is formed on an upper surface of the first insulation film 25 above the organic semiconductor 23.

The TFT 30 includes a second insulation film 27 that is formed on the upper surface of the first insulation film 25 and covers the gate electrode 21.

The plurality of individual electrodes (31X to 31Y) are formed on an upper surface of the second insulation film 27. The individual electrodes are connected to the TFTs 30 via conductive portions 29 formed in through holes that penetrate the first insulation film 25 and the second insulation film 27.

The principle of operation of the pressure sensor 1 is described with reference to FIG. 4. Drain current flows when a gate voltage is input to the TFT 30 and voltage is applied to the drain electrode 19 of the TFT 30. This drain current corresponds to resistance of the pressure-sensitive layer 11. Resistance of the pressure-sensitive layer 11 decreases when the pressure applied to the pressure-sensitive layer 11 increases. Therefore, an increase in drain current is detected. Pressure distribution on the front surface of a sheet can be observed by sweeping the TFT 30 on the pressure sensor 1, applying a gate voltage and measuring the drain current.

As illustrated in FIG. 1, the plurality of individual electrodes (31X to 31Y) include a first electrode 31X for detecting high pressure, a second electrode 31Y for detecting medium pressure and a third electrode 31Z for detecting low pressure. A gap H1 between the first electrode 31X and the pressure-sensitive layer 11 is the largest gap and the gap H3 between the third electrode 31Z and the pressure-sensitive layer 11 is the smallest gap. In other words, the gap H2 between the second electrode 31Y and the pressure-sensitive layer 11 is shorter than the gap H1 between the first electrode 31X and the pressure-sensitive layer 11. In addition, the gap H3 between the third electrode 31Z and the pressure-sensitive layer 11 is shorter than the gap H2 between the second electrode 31Y and the common electrode 9.

The thicknesses of the first electrode 31X, the second electrode 31Y and the third electrode 31Z and the gaps H1 to H3 can be arbitrarily set within a wide range. For example, the range may be between 0 and several ten μm and may be on the order of several μm or ten and several μm.

The pressure sensor 1 has a pressing force area. Within the pressing force area, the first electrode 31X, the second electrode 31Y and the third electrode 31Z are arranged in a row so as to be in a minimum pressing force area at any pressing point. The "minimum pressing force area" is a lower limit area assumed to always be pressed when a predetermined pushing object (for example, a finger or a pen) presses the pressure sensor.

The region subject to pressing may be the entire pressure sensor 1 or a portion of the pressure sensor 1.

As illustrated in FIG. 5, the first electrode 31X, the second electrode 31Y and the third electrode 31Z are evenly arranged alternately in one row. More specifically, the first electrode 31X, the second electrode 31Y and the third electrode 31Z are aligned such that the same type of electrodes are obliquely continuous. In this embodiment, the minimum pressing force area is an area by 3×3 in which at least three of each of the first electrode 31X, the second electrode 31Y and the third electrode 31Z are located to correspond with each other, regardless of which portion of the minimum pressing force area is pressed.

As illustrated in FIG. 2, a dot spacer 35 is formed on a lower surface of the pressure-sensitive layer 11 to correspond with the third electrode 31Z. The dot spacer 35 is a member that supports the frame spacer 13 and accurately secures a gap between the pressure-sensitive layer 11 and the third electrode 31Z.

Although the dot spacer is formed on the third electrode 31Z to achieve the above-described aim, dot spacers may also be located for the first electrode 31X and the second electrode 31Y. In fact, a dot spacer must be located for one or both of the first electrode 31X and/or the second electrode 31Y in a region where the first electrode 31X and the second electrode 31Y are aligned continuous with each other.

For example, the dot spacer is only formed on a portion of the third electrode 31Z and not on the entire third electrode 31Z. More specifically, one dot spacer is located for a plurality of (two to five) third electrodes 31Z.

The shape, quantity and positions of the dot spacers may be selected as appropriate according to the shape and size of the sensor, and the thickness and hardness of the upper film.

If a gap can be securely maintained between the common electrode 9 and the third electrode 31Z using only the frame spacer 13, fewer dot spacers 35 may be located, or the dot spacer 35 may be omitted altogether.

The pressure sensor 1 includes a circuit unit (not shown). The circuit unit controls the drain electrode 19, the source electrode 17 and the common electrode 9. The circuit unit includes, for example, a current detection circuit that generates a power supply voltage that applies a predetermined voltage to the common electrode 9 and the source electrode 17, and a signal that corresponds to the current value between the source and the drain and that outputs the signal to an external signal processing device. The external signal processing device detects the pressed position and pressing force on the basis of the signal sent from the circuit.

(3) Pressing Operation and Pressure Measurement Operation

Figure 6:
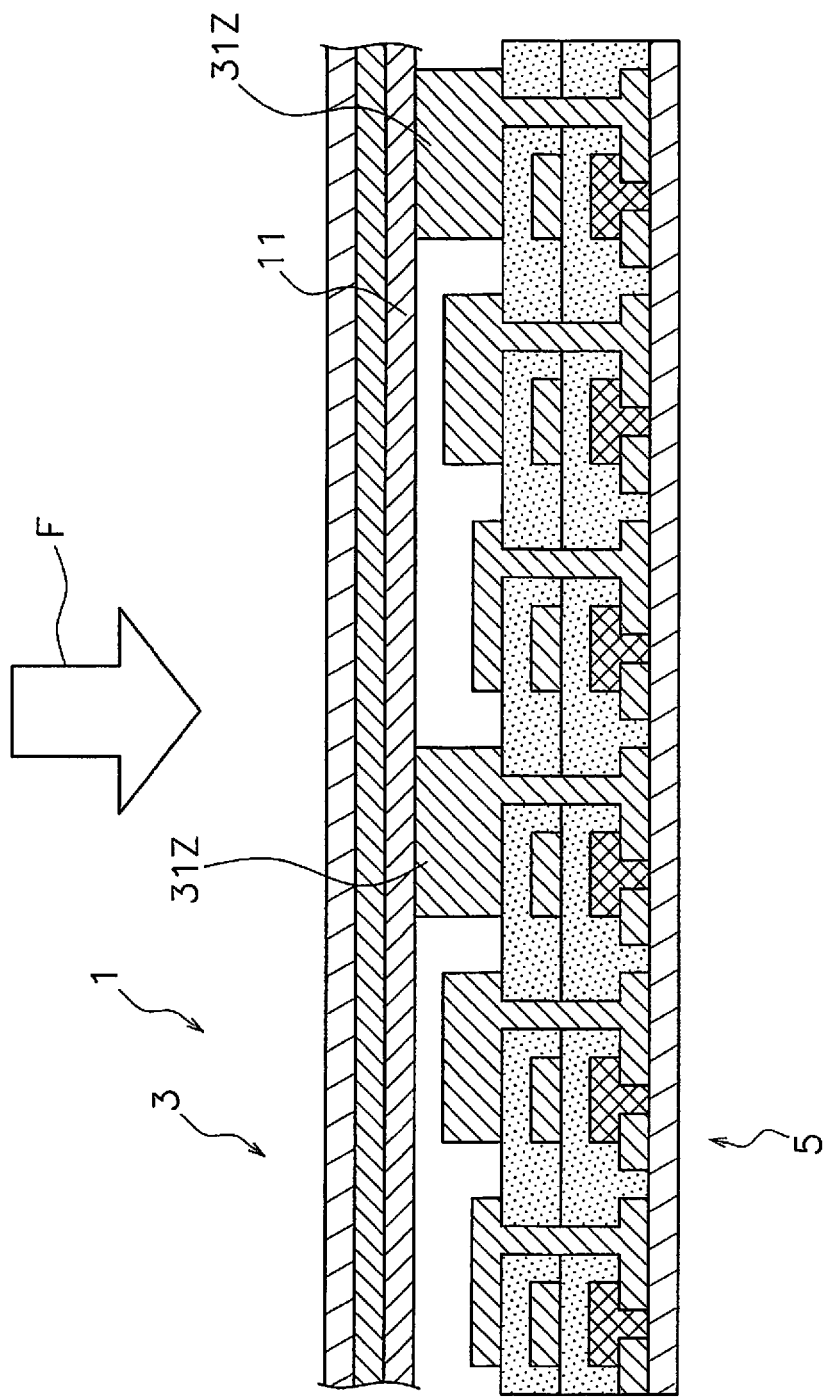
FIG. 6 is a schematic cross-sectional view of the pressure sensor under a state where pressure acts on the pressure sensor.
Figure 7:
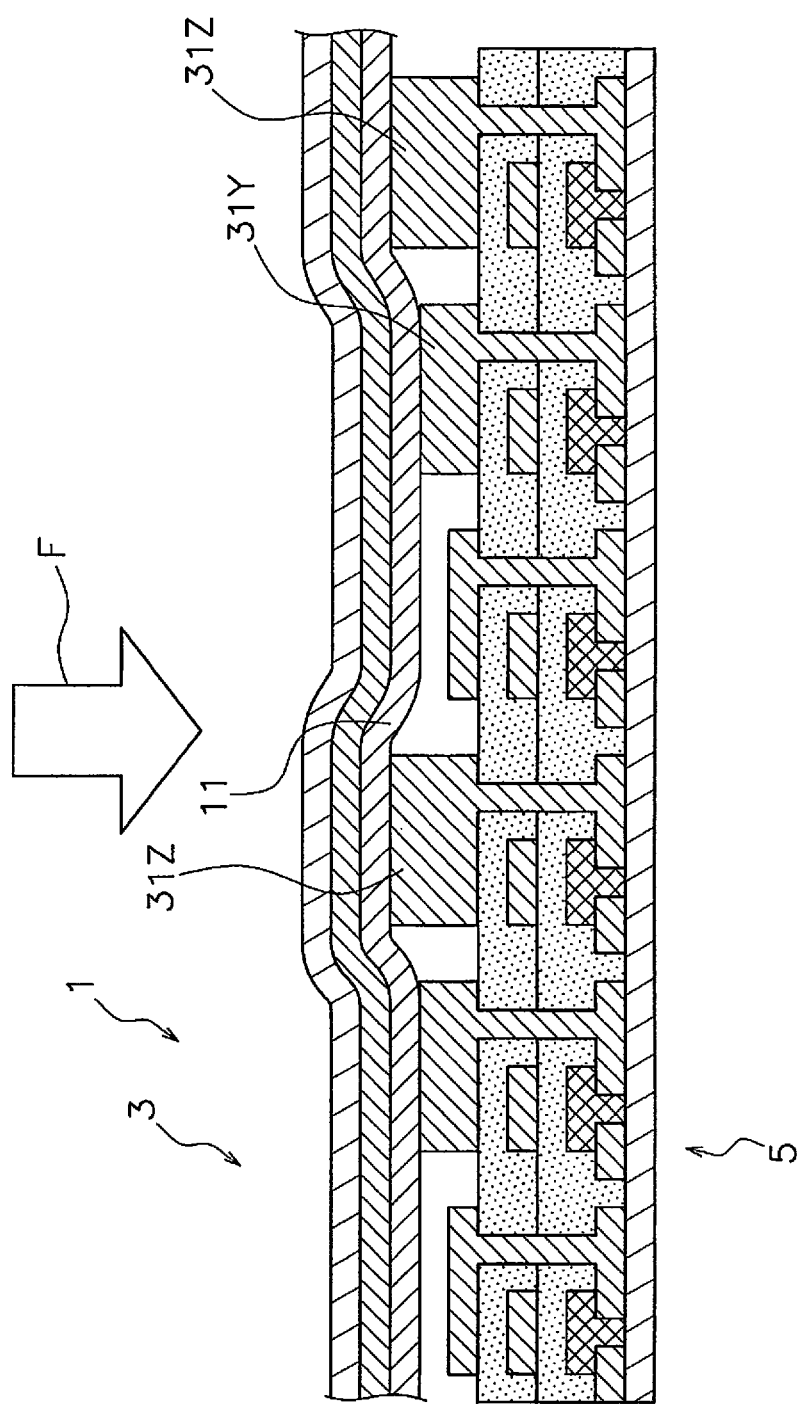
FIG. 7 is a schematic cross-sectional view of the pressure sensor under a state where pressure acts on the pressure sensor.
Figure 8:
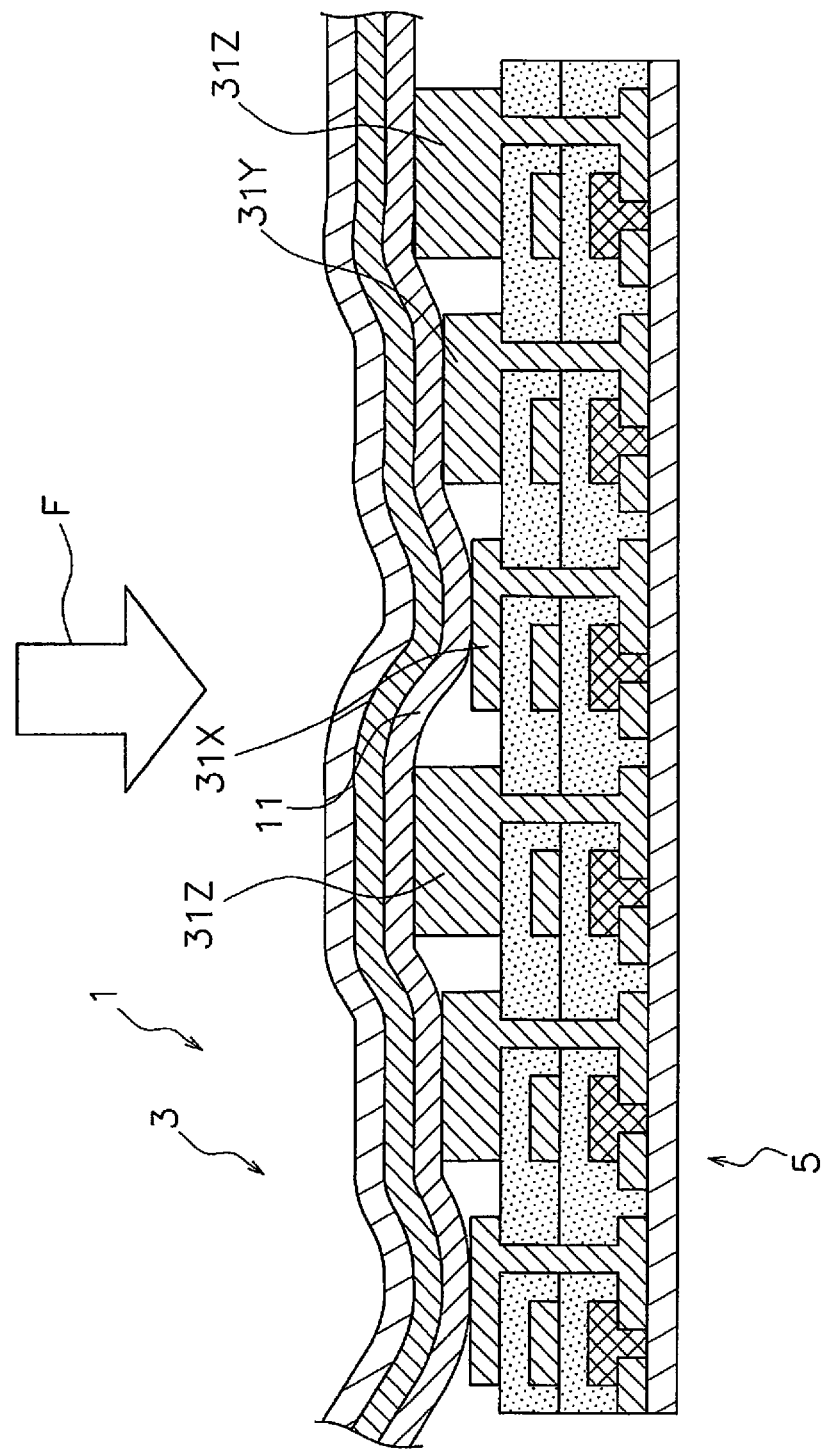
FIG. 8 is a schematic cross-sectional view of the pressure sensor under a state where pressure acts on the pressure sensor.
Figure 9:
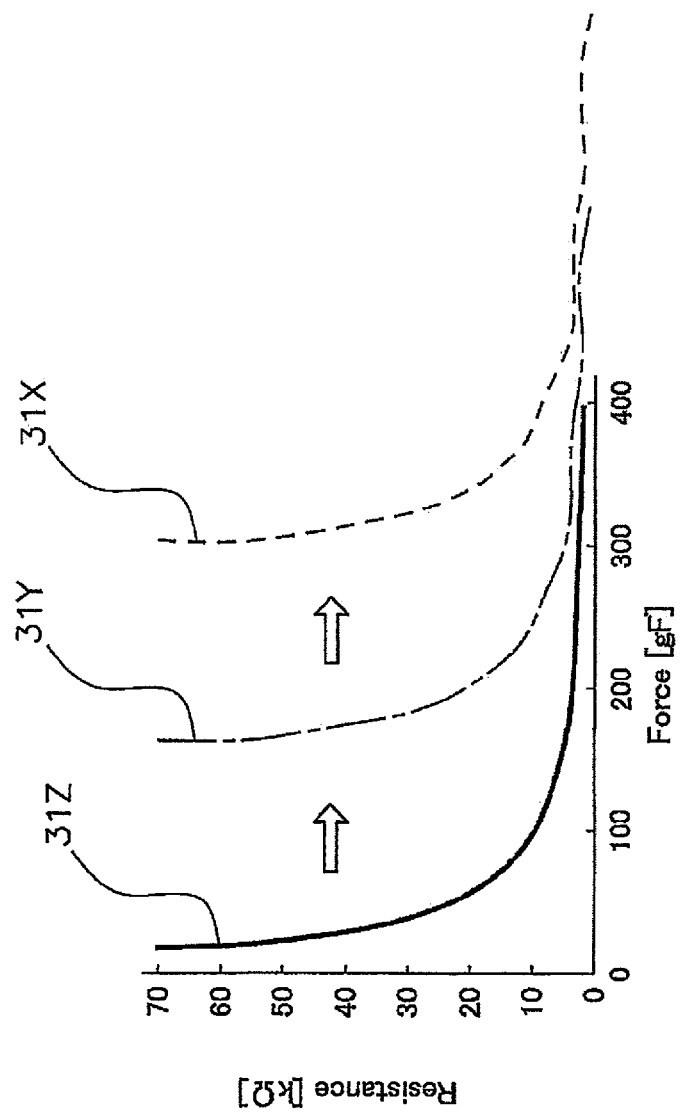
FIG. 9 is a graph showing the relationship between pressure and electrical resistance in the pressure sensor.

A pressing operation and a pressure measurement operation are described with reference to FIGS. 6 to 9. FIGS. 6 to 8 are schematic cross-sectional views of the pressure sensor under a state where pressure acts on the pressure sensor. FIG. 9 is a graph showing the relationship between pressure and electrical resistance in the pressure sensor.

As illustrated in FIG. 9, resistance of the pressure-sensitive layer 11 reduces when pressure is applied. The difference in potential between the source and the drain when a constant voltage is applied by the voltage power supply is dependent on the resistance value of the pressure-sensitive layer 11 that is connected in series to the drain electrode 19. As a result, the difference in potential between the source and the drain increases and the amount of flowing current also increases. Therefore, if the pressing force and current amount applied to the pressure-sensitive layer 11 are acquired in advance, the amount of pressure (pressing force) that is applied to the pressure sensor 1 can be detected through a signal processing device (not shown) reading a change in the signal according to current amount.

In FIG. 6, a small force F acts on the upper electrode member 3, and hence the pressure-sensitive layer 11 only makes contact with the third electrode 31Z. Therefore, as illustrated in FIG. 9, low pressure can be accurately measured using output from the TFT 30 that corresponds to the third electrode 31Z.

In FIG. 7, a medium force F acts on the upper electrode member 3, and hence the pressure-sensitive layer 11 makes contact with both the third electrode 31Z and the second electrode 31Y. Therefore, as illustrated in FIG. 9, medium pressure can be accurately measured using output from the TFT 30 that corresponds to the second electrode 31Y.

In FIG. 8, a large force F acts on the upper electrode member 3, and hence the pressure-sensitive layer 11 makes contact with the third electrode 31Z, the second electrode 31Y and the first electrode 31X. Therefore, as illustrated in FIG. 9, medium pressure can be accurately measured using output from the TFT 30 that corresponds to the first electrode 31X.

As described above, the region where the degree of change in resistance at each electrode is sufficiently high is shifted according to load. Therefore, low pressure, medium pressure and high pressure can be accurately measured.

The above-described operation will now be described in more detail.

In the pressure sensor 1, when pressure is low, only the third electrode 31Z makes contact with the common electrode 9. As a result, a change in resistance (that is, pressure) of the pressure-sensitive layer 11 can be accurately measured via the third electrode 31Z. When pressure is high, the common electrode 9 makes contact with both the third electrode 31Z and the second electrode 31Y. As a result, a change in resistance (that is, pressure) of the pressure-sensitive layer 11 can be accurately measured via the second electrode 31Y. This is because the gap between the second electrode 31Y and the common electrode 9 is long and the pressure measurement range in which electrical resistance can be accurately measured has shifted to a higher pressure side than that of the third electrode 31Z. In other words, the pressure measurement range corresponds to high pressure.

When pressure is even higher, the common electrode 9 makes contact with the first electrode 31X as well as the third electrode 31Z and the second electrode 31Y. As a result, a change in resistance (that is, pressure) of the pressure-sensitive layer 11 can be accurately measured via the first electrode 31X. This is because the gap between the first electrode 31X and the common electrode 9 is long and the pressure measurement range in which electrical resistance can be accurately measured has shifted to a higher pressure side than that of the second electrode 31Y. In other words, the pressure measurement range corresponds to high pressure.

In the pressure sensor 1, low pressure can be accurately measured with the third electrode 31Z, medium pressure can be accurately measured with the second electrode 31Y and high pressure can be accurately measured with the first electrode 31X, regardless of which pressing location is pressed in the region.

(4) Materials

The insulation films 7 and 15 may be made of an engineering plastic such as polycarbonate, polyamide or polyether ketone, or a resin film such as acrylic, polyethylene terephthalate or polybutylene terephthalate.

The dot spacer 35 may be made of a resin printing layer or coating layer such as an acrylic resin, an epoxy resin or a silicone resin.

The common electrode 9 and the individual electrodes 31 may be made of a metal oxide film including tin oxide, indium oxide, antimony oxide, zinc oxide, cadmium oxide, or indium tin oxide (ITO), a composite membrane mainly composed of the above-mentioned metal oxides, or a metal film including gold, silver, copper, tin, nickel, aluminum, or palladium.

The pressure-sensitive layer 11 is made of, for example, a pressure-sensitive ink. Pressure-sensitive ink is a material that enables pressure detection through varying contact resistance between the ink and an opposing electrode according to external force. A pressure-sensitive ink layer can be coated on another member. The pressure-sensitive ink layer may be applied through a printing method such as screen printing, offset printing, gravure printing or flexographic printing, or through using a dispenser.

(5) Method for Manufacturing Pressure Sensor

A method for manufacturing the pressure sensor 1 is described with reference to FIGS. 10 to 21. FIGS. 10 to 21 are schematic cross-sectional views for illustrating the method for manufacturing the pressure sensor.

First, each step in a method for manufacturing the lower electrode member 5 is described with reference to FIGS. 10 to 17.

Figure 10:
FIG. 10 is a schematic cross-sectional view for illustrating a method for manufacturing the pressure sensor.

As illustrated in FIG. 10, an electrode material 37 is formed on one surface of the insulation film 15 through, for example, sputtering.

Figure 11:
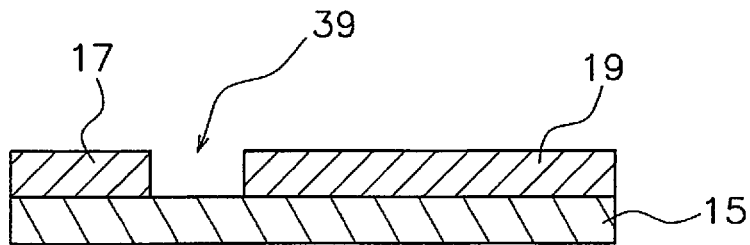
FIG. 11 is a schematic cross-sectional view for illustrating a method for manufacturing the pressure sensor.

As illustrated in FIG. 11, a film exposure portion 39 is formed by removing a portion of the electrode material 37 by, for example, photolithography. With this method, the source electrode 17 and the drain electrode 19 are formed. Note that the methods for forming the source electrode 17 and the drain electrode 19 are not particularly limited.

Figure 12:
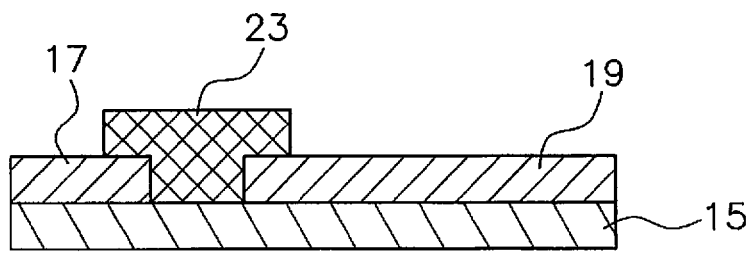
FIG. 12 is a schematic cross-sectional view for illustrating a method for manufacturing the pressure sensor.

As illustrated in FIG. 12, the organic semiconductor 23 is formed in the film exposure portion 39. The organic semiconductor 23 is formed using well-known technology.

Figure 13:
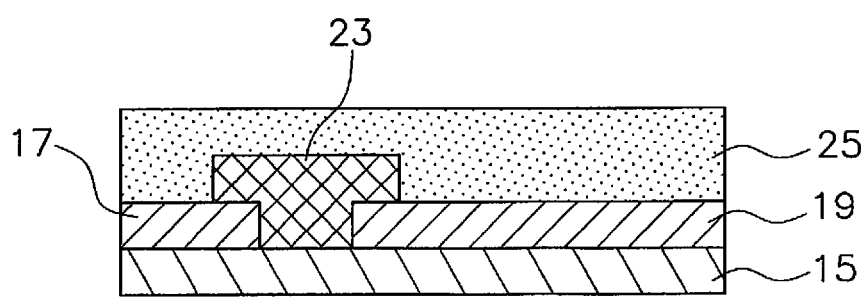
FIG. 13 is a schematic cross-sectional view for illustrating a method for manufacturing the pressure sensor.

As illustrated in FIG. 13, the first insulation film 25 is formed so as to cover the surface that is formed with the source electrode 17, the drain electrode 19 and the organic semiconductor 23.

Figure 14:
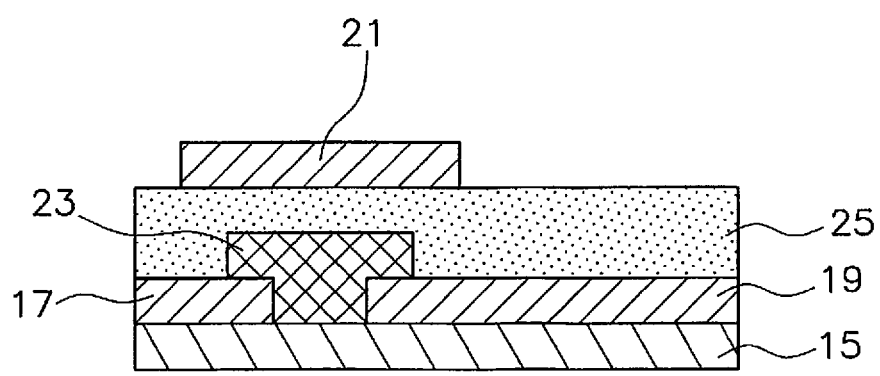
FIG. 14 is a schematic cross-sectional view for illustrating a method for manufacturing the pressure sensor.

As illustrated in FIG. 14, the gate electrode 21 is formed on the upper surface of the first insulation film 25 above the organic semiconductor 23. The gate electrode 21 is formed using well-known technology.

Figure 15:
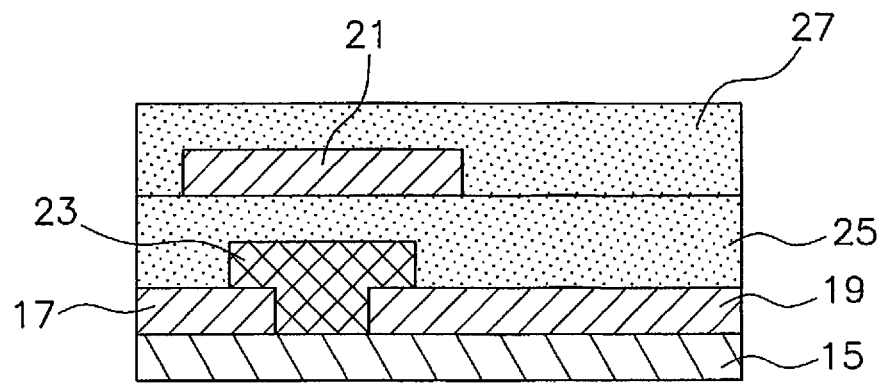
FIG. 15 is a schematic cross-sectional view for illustrating a method for manufacturing the pressure sensor.

As illustrated in FIG. 15, the second insulation film 27 is formed so as to entirely cover the first insulation film 25 formed with the gate electrode 21.

Figure 16:
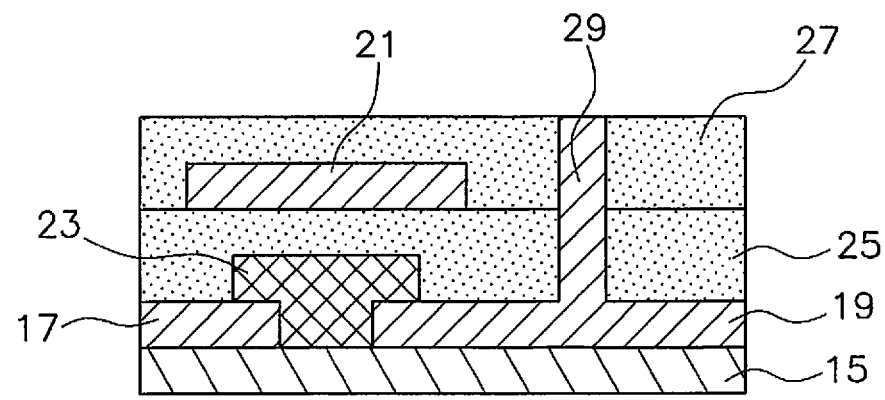
FIG. 16 is a schematic cross-sectional view for illustrating a method for manufacturing the pressure sensor.

As illustrated in FIG. 16, through holes that reach the drain electrode 19 are formed in the first insulation film 25 and the second insulation film 27 using a laser. The through holes are embedded with a conductive material to form the conductive portion 29.

Figure 17:
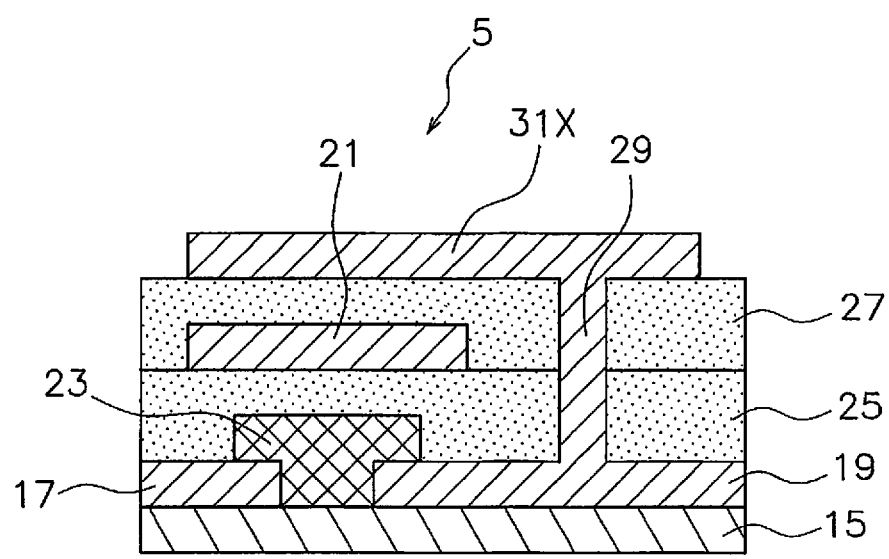
FIG. 17 is a schematic cross-sectional view for illustrating a method for manufacturing the pressure sensor.
Figure 18:
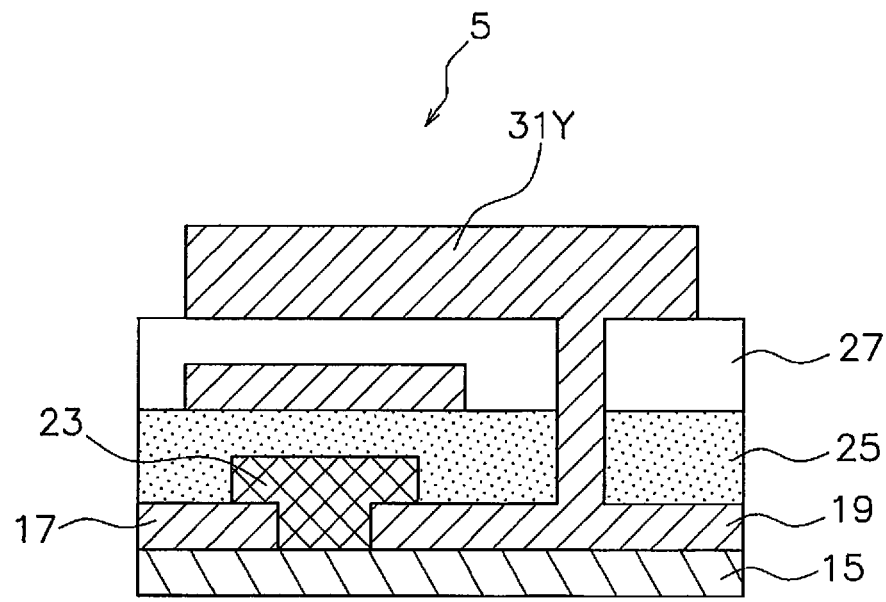
FIG. 18 is a schematic cross-sectional view for illustrating a method for manufacturing the pressure sensor.

As illustrated in FIG. 17, the first electrode 31X is formed using a printing method and is connected to the TFT 30 through the conductive portion 29. As illustrated in FIG. 18, the second electrode 31Y is formed. Although not shown, the third electrode 31Z is also formed.

If performing screen printing, different types of screen printing plates are used to give the individual electrodes different thicknesses. More specifically, the print film thickness is determined by the thickness and aperture ratio of the screen mesh. Therefore, individual electrodes having different thicknesses can be formed without considering other conditions by simply changing the thickness of the screen mesh.

The individual electrodes may be formed using a combination of printing and another method. For example, the individual electrodes may be formed by sputtering a metal or metal oxide and then performing photolithography. A conductive layer may be further printed onto the individual electrodes used for low and medium pressure measurement to give those electrodes different thicknesses.

Now, manufacturing of the upper electrode member 3 is described with reference to FIGS. 19 to 21.

Figure 19:
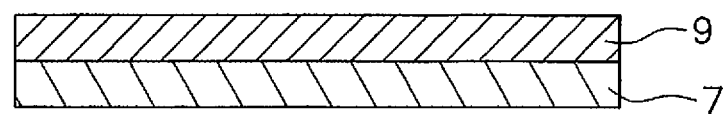
FIG. 19 is a schematic cross-sectional view for illustrating a method for manufacturing the pressure sensor.

As illustrated in FIG. 19, the common electrode 9 is formed using a printing method. The material for the common electrode 9 may first be applied to one surface of the insulation film 7 through, for example, sputtering and then the common electrode 9 may be formed using a photolithography method.

Figure 20:
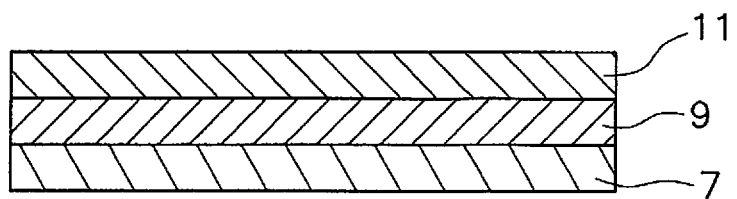
FIG. 20 is a schematic cross-sectional view for illustrating a method for manufacturing the pressure sensor.

As illustrated in FIG. 20, the pressure-sensitive layer 11 is formed on one surface of the common electrode 9 through printing. However, the pressure-sensitive layer 11 is not formed on an external part of the common electrode 9 that is removed.

Figure 21:
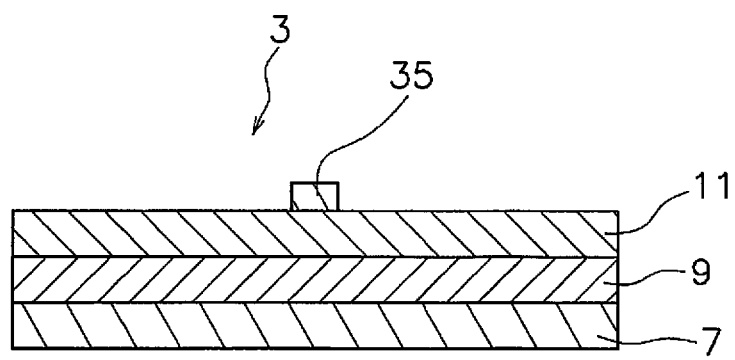
FIG. 21 is a schematic cross-sectional view for illustrating a method for manufacturing the pressure sensor.

As illustrated in FIG. 21, a plurality of dot spacers 35 are formed on the pressure-sensitive layer 11.

Finally, the upper electrode member 3 and the lower electrode member 5 are joined together using the frame-shaped frame spacer 13 (FIG. 2) made of an adhesive, to thereby complete the pressure sensor 1.

2. Second Embodiment

In the above-described embodiment, the dot spacers are formed on the upper electrode member, but the dot spacers may be formed on the lower electrode member.

Figure 22:
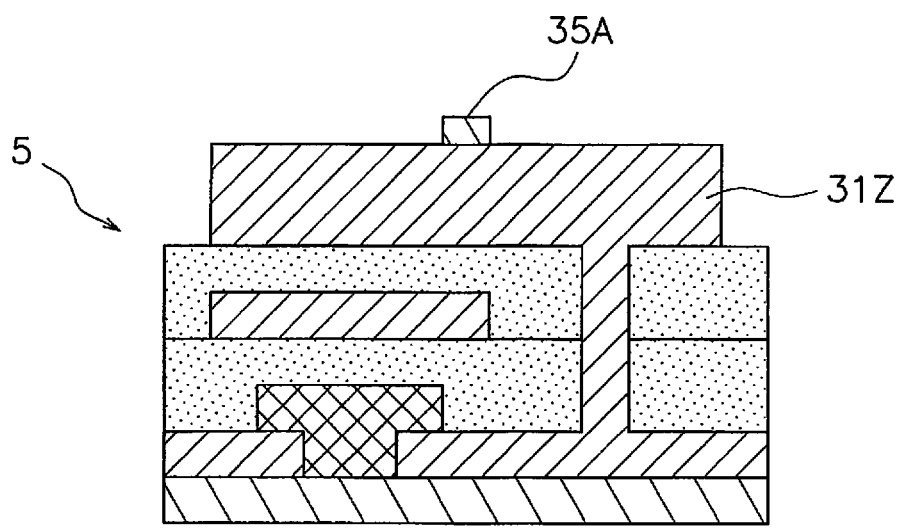
FIG. 22 is a schematic cross-sectional view for illustrating a method for manufacturing the pressure sensor according to a second embodiment.

An embodiment in which the dot spacers are formed on the lower electrode member is described with reference to FIGS. 22 and 23. FIGS. 22 and 23 are schematic cross-sectional views for illustrating a method for manufacturing the pressure sensor according to a second embodiment.

As illustrated in FIG. 22, a plurality of dot spacers 35A are formed on the third electrode 31Z. The same applies to the first electrode 31X and the second electrode 31Y.

Then, as illustrated in FIG. 23, the upper electrode member 3 and the lower electrode member 5 are joined together to complete the pressure sensor.

3. Third Embodiment

In the first embodiment, the TFT is a top gate transistor, but the TFT may be a bottom gate transistor.

An embodiment in which the TFT is a bottom gate transistor is described with reference to FIG. 24. FIG. 24 is a partial schematic cross-sectional view of a pressure sensor according to the third embodiment. This embodiment differs from the first embodiment only in terms of the structure of the TFT.

As illustrated in FIG. 24, a source electrode 17A, a drain electrode 19A and an organic semiconductor 23A are formed on a first insulation film 25A, and a gate electrode 21A is formed on an insulation film 15A.

4. Fourth Embodiment

In the above-described embodiments, the pressure-sensitive layer is formed on the common electrode, but the pressure-sensitive layer may be formed on the individual electrodes.

Figure 25:
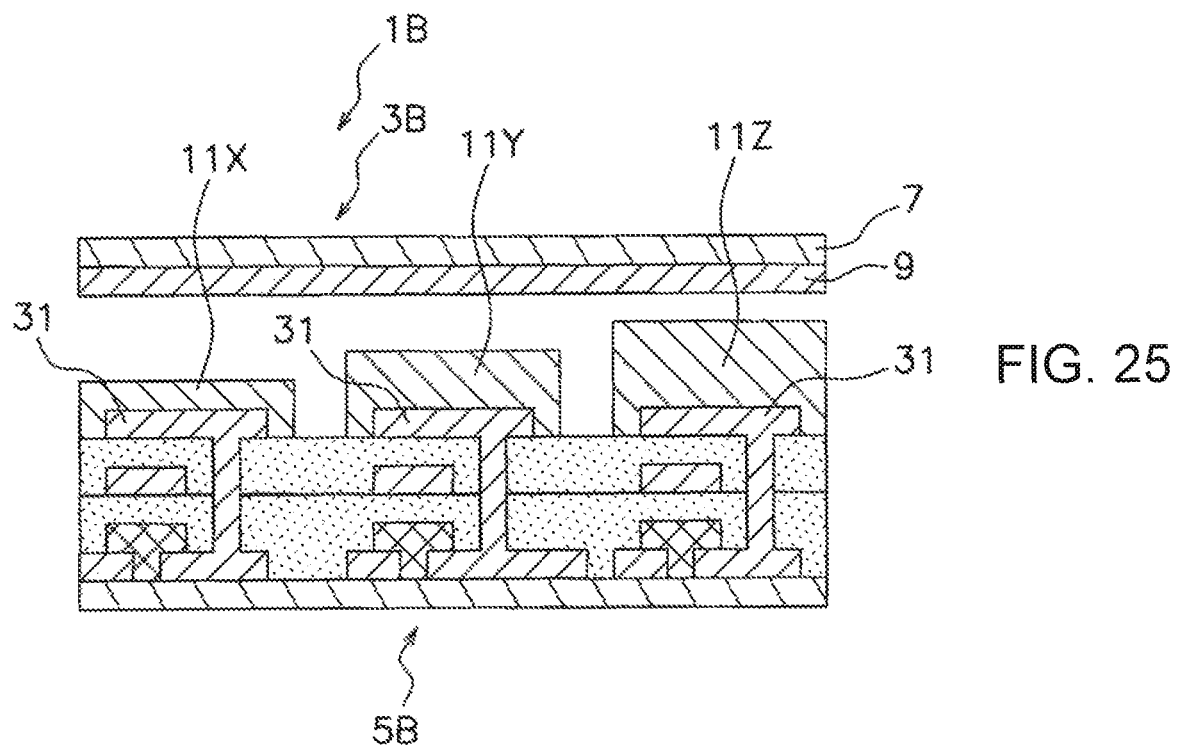
FIG. 25 is a partial schematic cross-sectional view for illustrating a pressure sensor according to a fourth embodiment.

An embodiment in which the pressure-sensitive layer is formed on the individual electrodes is described with reference to FIG. 25. FIG. 25 is a partial schematic cross-sectional view of a pressure sensor according to the fourth embodiment.

As illustrated in FIG. 25, the thickness of the individual electrodes 31 is constant.

An individual electrode 31 formed with a thin first pressure-sensitive layer 11X (example of a first individual pressure-sensitive layer) functions similarly to the first electrode 31X according to the first embodiment and detects high pressure.

An individual electrode 31 formed with a medium-thickness second pressure-sensitive layer 11Y (example of a second individual pressure-sensitive layer) functions similarly to the second electrode 31Y according to the first embodiment and detects medium pressure.

An individual electrode 31 formed with a thick third pressure-sensitive layer 11Z (example of a third individual pressure-sensitive layer) functions similarly to the third electrode 31Z according to the first embodiment and detects low pressure.

5. Fifth Embodiment

In the fourth embodiment, the TFT is a top gate transistor, but the TFT may be a bottom gate transistor.

Figure 26:
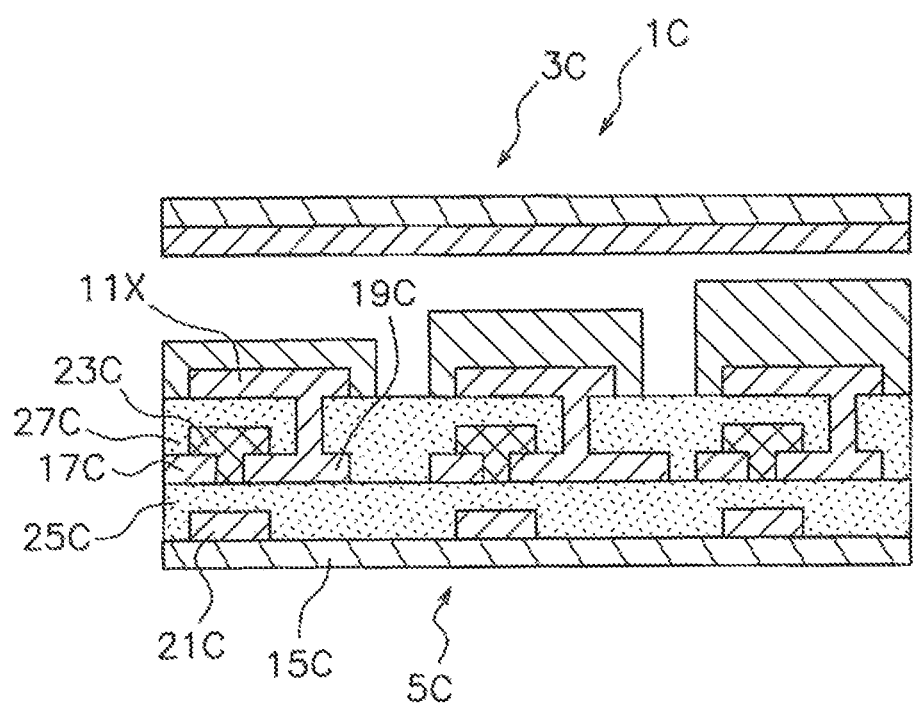
FIG. 26 is a partial schematic cross-sectional view for illustrating a pressure sensor according to a fifth embodiment.

An embodiment similar to the fourth embodiment but in which the TFT is a bottom gate transistor is described with reference to FIG. 26. FIG. 26 is a partial schematic cross-sectional view of a pressure sensor according to the fifth embodiment. This embodiment differs from the fourth embodiment only in terms of the structure of the TFT.

As illustrated in FIG. 26, a source electrode 17C, a drain electrode 19C and the organic semiconductor 23C are formed on a first insulation film 25C and a gate electrode 21C is formed on an insulation film 15C.

6. Sixth Embodiment

In any of the first to fifth embodiments, the pressure-sensitive layer is formed on only one of the upper electrode member or the lower electrode member, but pressure-sensitive members may be formed on both electrode members and oppose each other with a gap therebetween.

Figure 27:
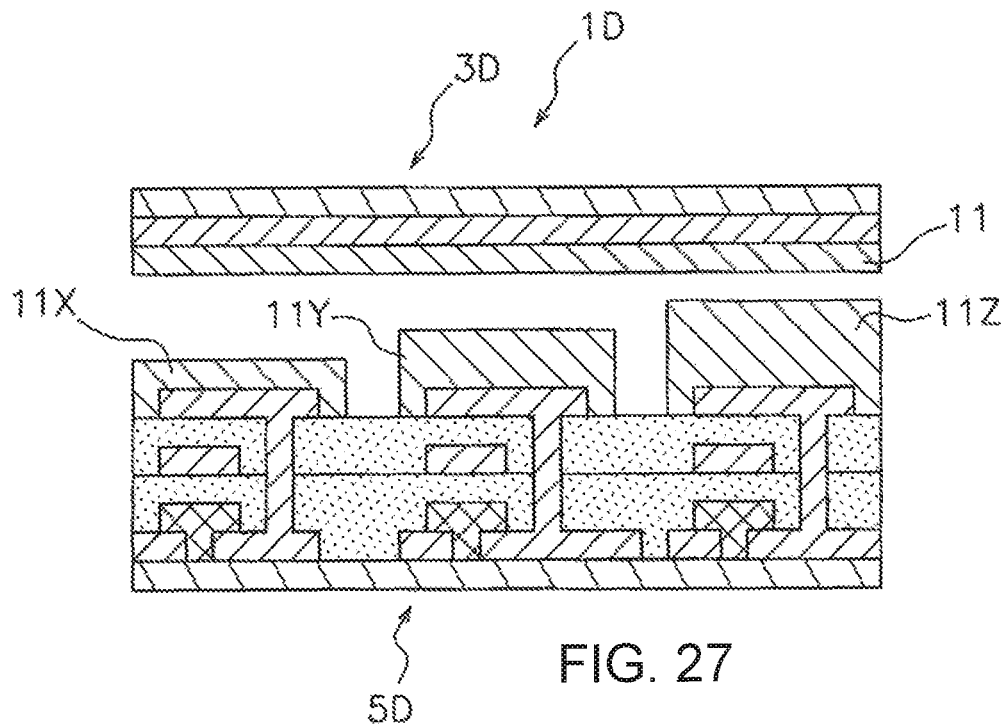
FIG. 27 is a partial schematic cross-sectional view for illustrating a pressure sensor according to a sixth embodiment.

An embodiment in which pressure-sensitive members are formed on both electrode members and oppose each other is described with reference to FIG. 27. FIG. 27 is a partial schematic cross-sectional view of a pressure sensor according to the sixth embodiment.

In an upper electrode member 3D, a pressure-sensitive layer 11 (example of a common pressure-sensitive layer) is formed on one surface of the common electrode 9.

In an upper electrode member 5D, the thickness of the individual electrodes 31 is constant and each individual electrode 31 is formed with the thin first pressure-sensitive layer 11X (example of a first individual pressure-sensitive layer), the medium-thickness second pressure-sensitive layer 11Y (example of a second individual pressure-sensitive layer) and the thick third pressure-sensitive layer 11Z.

7. Seventh Embodiment

In the sixth embodiment, the TFT is a top gate transistor, but the TFT may be a bottom gate transistor.

Figure 28:
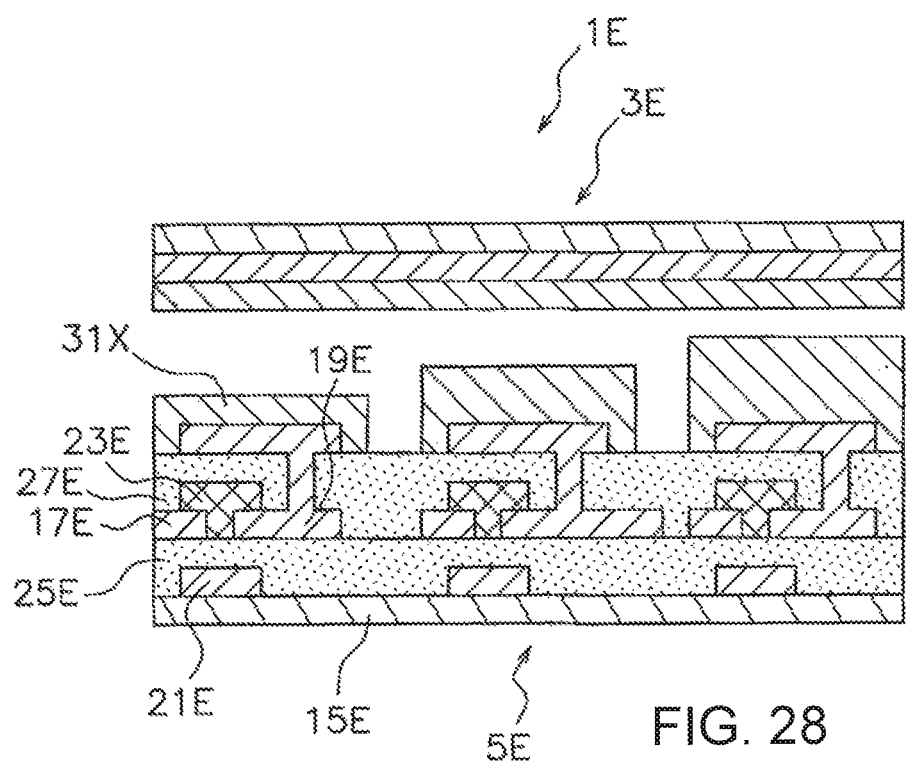
FIG. 28 is a partial schematic cross-sectional view for illustrating a pressure sensor according to a seventh embodiment.

An embodiment similar to the sixth embodiment but in which the TFT is a bottom gate transistor is described with reference to FIG. 28. FIG. 28 is a partial schematic cross-sectional view of a pressure sensor according to the seventh embodiment. This embodiment differs from the sixth embodiment only in terms of the structure of the TFT.

As illustrated in FIG. 28, a source electrode 17E, a drain electrode 19E and an organic semiconductor 23E are formed on a first insulation film 25E and a gate electrode 21E is formed on an insulation film 15E.

8. Eighth Embodiment

In the first to seventh embodiments, the structure for changing the thickness of an electrode involves only changing the thickness of either the individual electrode or the pressure-sensitive layer. However, the gap between the individual electrode and the common electrode may be controlled by changing the thickness of both the individual electrode and the pressure-sensitive layer.

Figure 29:
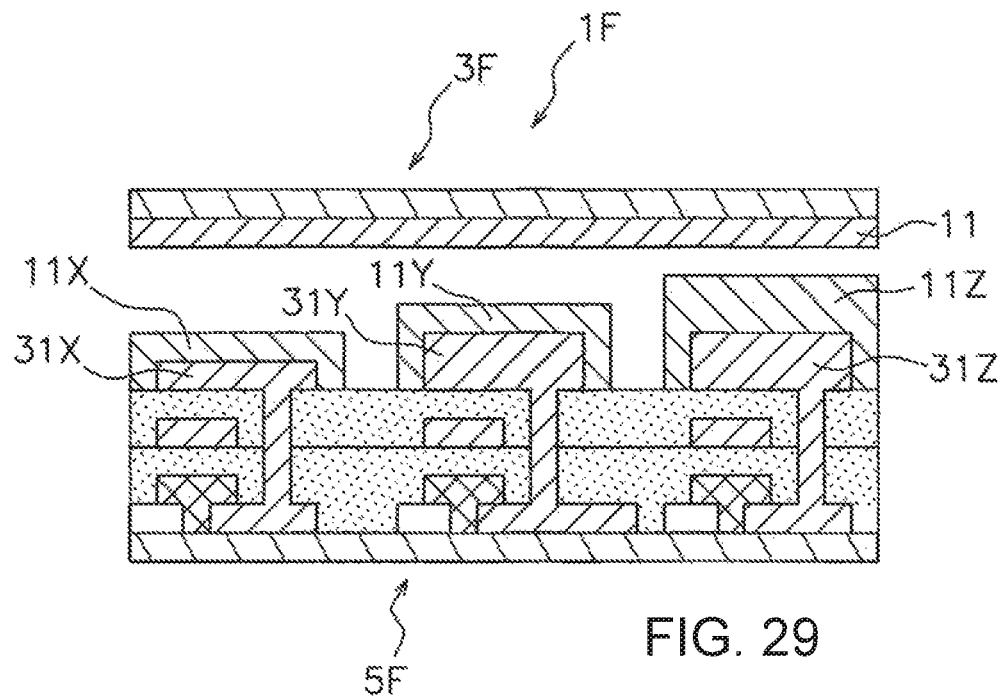
FIG. 29 is a partial schematic cross-sectional view for illustrating a pressure sensor according to an eighth embodiment.

An embodiment in which the thickness of both the individual electrode and the pressure-sensitive layer are changed is described with reference to FIG. 29. FIG. 29 is a partial schematic cross-sectional view of a pressure sensor according to the eighth embodiment.

The first pressure-sensitive layer 11X is formed on the first electrode 31X. Both members are thin layers and function as electrodes for detecting high pressure, similar to the first electrode 31X according to the first embodiment.

The second pressure-sensitive layer 11Y is formed on the second electrode 31Y. The second electrode 31Y is a thick layer and the second pressure-sensitive layer 11Y is a thin layer, and both members function as electrodes for detecting medium pressure, similar to the second electrode 31Y according to the first embodiment.

The third pressure-sensitive layer 11Z is formed on the third electrode 31Z. Both members are thick layers and function as electrodes for detecting low pressure, similar to the third electrode 31Z according to the first embodiment.

9. Ninth Embodiment

In the eighth embodiment, the TFT is a top gate transistor, but the TFT may be a bottom gate transistor.

Figure 30:
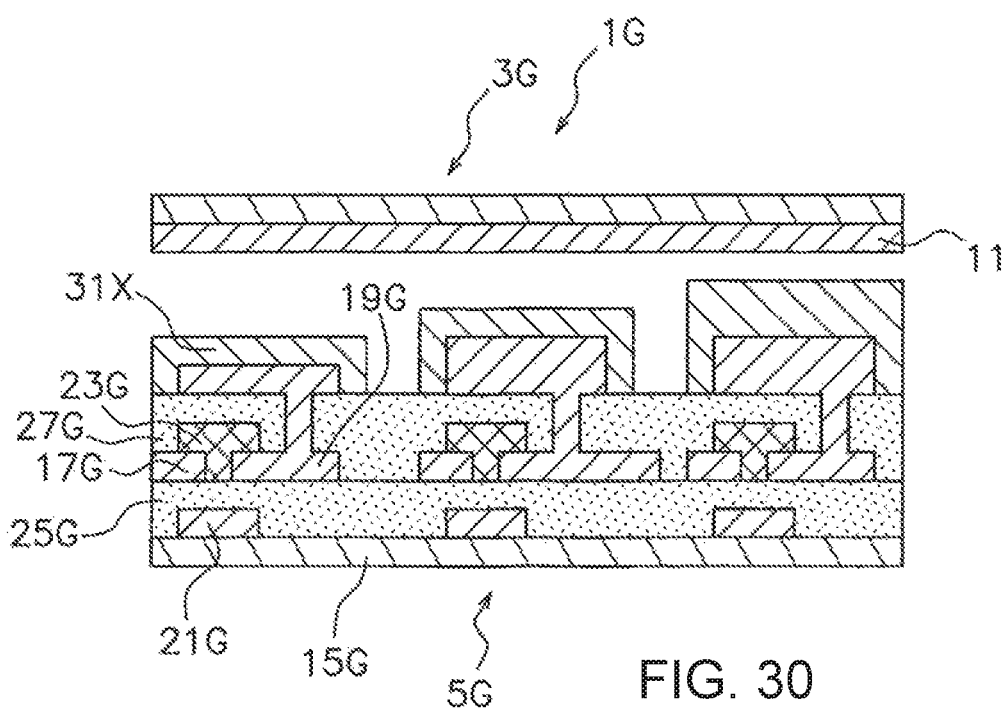
FIG. 30 is a partial schematic cross-sectional view for illustrating a pressure sensor according to a ninth embodiment.

An embodiment similar to the eighth embodiment but in which the TFT is a bottom gate transistor is described with reference to FIG. 30. FIG. 30 is a partial schematic cross-sectional view of a pressure sensor according to the ninth embodiment. This embodiment differs from the eighth embodiment only in terms of the structure of the TFT.

As illustrated in FIG. 30, a source electrode 17G, a drain electrode 19G and an organic semiconductor 23G are formed on a first insulation film 25G and a gate electrode 21G is formed on an insulation film 15G.

10. Tenth Embodiment

In the second embodiment, top spacers are formed on the individual electrodes, but the quantity and positions of the top spacers are not particularly limited. However, the top spacers are preferably evenly disposed on the individual electrodes.

Figure 31:
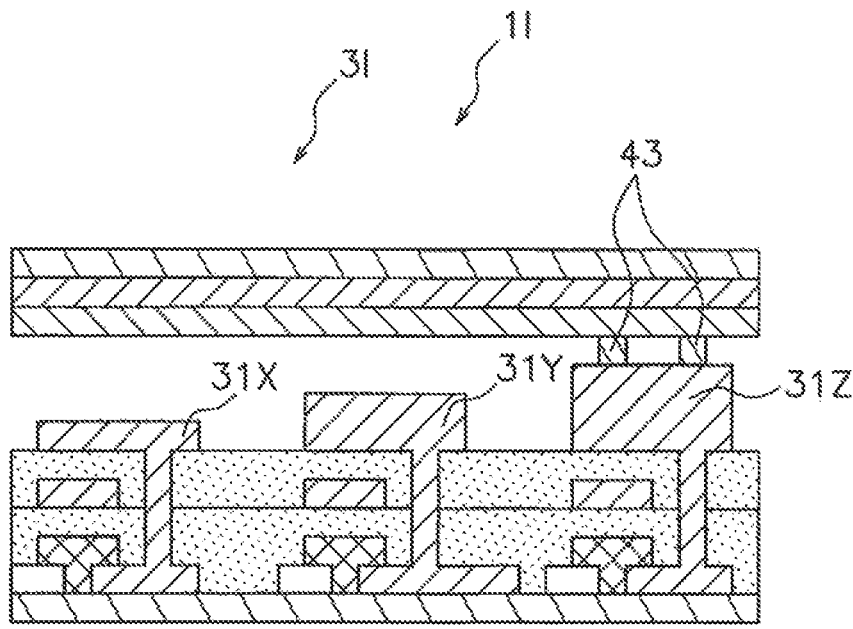
FIG. 31 is a partial schematic cross-sectional view for illustrating a pressure sensor according to a tenth embodiment.
Figure 32:
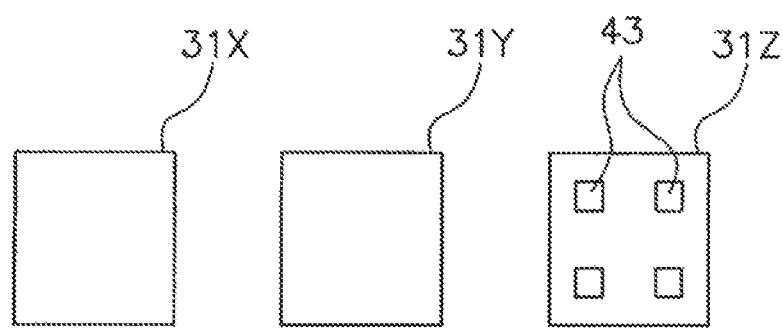
FIG. 32 is a partial schematic plan view of the pressure sensor according to the tenth embodiment.

An embodiment in which the top spacers are evenly disposed is described with reference to FIGS. 31 and 32. FIG. 31 is a partial schematic cross-sectional view of a pressure sensor according to the tenth embodiment. FIG. 32 is a partial schematic cross-sectional view of a pressure sensor according to the tenth embodiment.

A plurality of dot spacers 43 are formed on part of the third electrode 31Z.

As illustrated in FIG. 32, a plurality of (four) dot spacers 43 are formed on the third electrode 31Z and the dot spacers 43 are evenly arranged across the entire third electrode 31Z.

Note that the dot spacers may also be formed on the first electrode 31X and the second electrode 31Y.

11. Eleventh Embodiment

In the first to tenth embodiments, the first electrode 31X, the second electrode 31Y and the third electrode 31Z are evenly arranged alternately in one row. However, the first electrode 31X, the second electrode 31Y and the third electrode 31Z do not need to be evenly arranged.

Figures 33, 34:
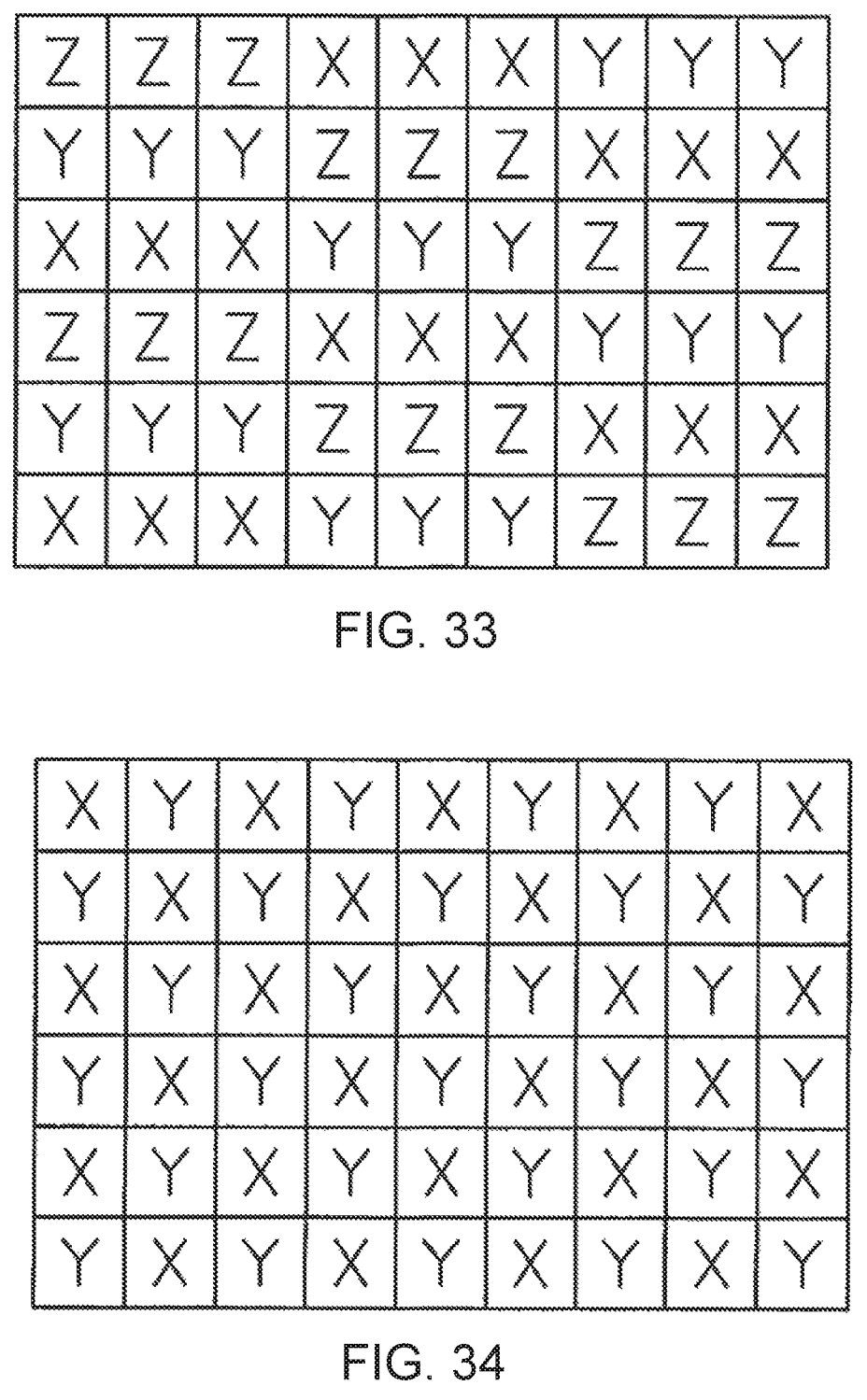

An embodiment in which the first electrode 31X, the second electrode 31Y and the third electrode 31Z are not evenly arranged is described with reference to FIG. 33. FIG. 33 is a schematic plan view for illustrating arrangement of the individual electrodes according to the eleventh embodiment.

Three of the same type of the first electrode 31X, the second electrode 31Y and the third electrode 31Z are arranged side by side.

Even in this embodiment, the minimum pressing force area is an area by 3×3 in which at least three of each of the first electrode 31X, the second electrode 31Y and the third electrode 31Z are located to correspond with each other, regardless of which portion of the minimum pressing force area is pressed.

Variations for arranging the individual electrodes are not limited to those described above.

12. Twelfth Embodiment

In the above-described embodiments, there are three different types of individual electrodes that create different gaps with the common electrode, but there may be two different types.

An embodiment in which there are two different types of individual electrodes is described with reference to FIG. 34. FIG. 34 is a schematic plan view for illustrating arrangement of the individual electrodes according to the twelfth embodiment.

The pressure sensor 1 includes the region subject to pressing. In the region subject to pressing, the first electrode 31X and the second electrode 31Y are preferably arranged in a row so as to be within minimum pressing force area regardless of which pressing location is pressed. The first electrode 31X is an electrode that detects high pressure and the second electrode 31Y is an electrode that detects low pressure.

As illustrated in FIG. 34, the first electrode 31X and the second electrode 31Y are arranged evenly alternately in one row. More specifically, the first electrode 31X and the second electrode 31Y are arranged such that the same type of electrodes are obliquely continuous.

In this embodiment, the minimum pressing force area is an area by 2×2 in which at least two of each of the first electrode 31X and the second electrode 31Y are located to correspond with each other regardless of which portion of the minimum pressing force area is pressed.

There may be four or more different types of individual electrodes that create different gaps with the common electrode.

13. Common Aspects Across Embodiments

The following aspects are common across all embodiments.

As the configuration on the side of the common electrode, a concept including both the configuration of only the common electrode and the configuration of a combination of the common electrode and the pressure-sensitive layer is defined as a "common conductive layer". As the configuration on the side of a first individual electrode, a concept including both the configuration of only the first individual electrode and the configuration of a combination of the first individual electrode and the pressure-sensitive layer is defined as a "first individual conductive layer". As the configuration on the side of a second individual electrode, a concept including both the configuration of only the second individual electrode and the configuration of a combination of the second individual electrode and the pressure-sensitive layer is defined as a "second individual conductive layer".

According to the above concepts, a gap is formed between the common conductive layer and the first and second individual conductive layers. Further, at least one of the common conductive layer and the first and second individual conductive layers has a pressure-sensitive layer.

In this pressure sensor, when pressure is low, only the second individual conductive layer makes contact with the common conductive layer. As a result, a change in resistance (that is, pressure) of the pressure-sensitive layer can be accurately measured via the second individual electrode. When pressure is high, the common conductive layer makes contact with both the second individual conductive layer and the first individual conductive layer. As a result, a change in resistance (that is, pressure) of the pressure-sensitive layer can be accurately measured via the first individual electrode. This is because the gap between the first individual conductive layer and the common conductive layer is long and the pressure measurement range in which electrical resistance can be accurately measured has shifted to a higher pressure side than that of the second individual conductive layer. In other words, the pressure measurement range corresponds to high pressure.

14. Modification Examples

In the first to twelfth embodiments, a thin-film transistor is located for each individual electrode and the current of each thin-film transistor is detected. In other words, one thin-film transistor is connected to one individual electrode.

However, a plurality of thin-film transistors may be located for one individual electrode and the current of the plurality of thin-film transistors may be detected. More specifically, two or more adjacent thin-film transistors are connected to one individual electrode. With this configuration, the current value to be detected increases and circuit redundancy can be achieved.

An example in which a total of four thin-film transistors arranged in the 2×2 pattern illustrated in FIG. 4 are located for one individual electrode is described. In this case, gate lines G1 and G2, source lines S1 and S2, and four drain electrodes are short-circuited to connect the four thin-film transistors to one individual electrode via a through hole and a conduction portion.

The thin-film transistors may be combined in a plurality of different ways. For example, the pattern of combination may be 2×3, 3×2, 4×4, or 5×2. A plurality of combination patterns may exist for one pressure device.

2. Other Embodiments

A plurality of embodiments of the present disclosure have been described above, but the present disclosure is not limited to the above-described embodiments and may be changed in various ways without departing from the gist of the disclosure. The plurality of embodiments and modification examples described herein may be arbitrarily combined as necessary.

For example, the configuration of the dot spacer may be applied to any of the above-described embodiments as needed.

The present disclosure can be broadly applied to any pressure sensor that includes a pressure-sensitive layer and a plurality of thin-film transistors that function as electrodes. In particular, the pressure sensor according to the present disclosure is suited to a large-area sheet sensor. More specifically, the pressure sensor according to the present disclosure can be applied to technology for measuring walking (for medical, sports and security applications) or technology for measuring bedsores.

REFERENCE SYMBOLS LIST

1: pressure sensor
3: upper electrode member
5: lower electrode member
7: insulation film
9: common electrode
11: pressure-sensitive layer
13: frame spacer
15: insulation film
17: source electrode
19: drain electrode
21: gate electrode
23: organic semiconductor
25: first insulation film
27: second insulation film
30: thin-film transistor
31: individual electrode
35: dot spacer

The invention claimed is:

1. A pressure sensor comprising:
   a common electrode formed as a layer;
   a plurality of individual electrodes arranged in a matrix opposing the common electrode;
   a plurality of thin-film transistors respectively located corresponding to the plurality of individual electrodes on sides of the plurality of individual electrodes opposite to the common electrode, where one or two or more adjacent thin-film transistors are connected to one individual electrode; and
   a common pressure-sensitive layer disposed on a surface of the common electrode on a side facing the plurality of individual electrodes,
   the plurality of individual electrodes including a first electrode, and a second electrode that is thicker than the first electrode and therefore creates a smaller gap from the common pressure-sensitive layer than the first electrode.

2. The pressure sensor according to claim 1, further including
   a region subject to pressing where the first electrode and the second electrode are arranged in a row so as to be within a minimum pressing force area, regardless of which position of the region is pressed.

3. The pressure sensor according to claim 1, further comprising
a spacer formed on a surface of the common electrode on a side that faces the plurality of the individual electrodes to oppose the plurality of individual electrodes.

4. The pressure sensor according to claim 1, further comprising
spacers formed on surfaces of the plurality of individual electrodes on sides that face the common electrode to oppose the common electrode.

5. A pressure sensor comprising:
a common electrode formed as a layer;
a plurality of individual electrodes arranged in a matrix opposing the common electrode;
a plurality of thin-film transistors respectively located corresponding to the individual electrodes on sides of the individual electrodes opposite to the common electrode, where one or two or more adjacent thin-film transistors are connected to one individual electrode;
a first individual pressure-sensitive layer disposed on a surface of a first electrode among the plurality of individual electrodes on a side facing the common electrode; and
a second individual pressure-sensitive layer disposed on a surface of a second electrode among the plurality of individual electrodes on a side facing the common electrode,
with a gap between the second individual pressure-sensitive layer and the common electrode shorter than a gap between the first individual pressure-sensitive layer and the common electrode.

6. The pressure sensor according to claim 5, wherein the second electrode is thicker than the first electrode.

7. The pressure sensor according to claim 5, wherein the second individual pressure-sensitive layer is thicker than the first individual pressure-sensitive layer.

8. The pressure sensor according to claim 5, further including
a region subject to pressing where the first individual pressure-sensitive layer and the second individual pressure-sensitive layer are arranged in a row so as to be within a minimum pressing force area, regardless of which position of the region is pressed.

9. The pressure sensor according to claim 5, further comprising
a spacer formed on a surface of the common electrode on a side that faces the plurality of the individual electrodes to oppose the plurality of the individual electrodes.

10. The pressure sensor according to claim 5, further comprising
spacers formed on surfaces of the first individual pressure-sensitive layer and the second individual pressure-sensitive layer on sides that face the common electrode to oppose the common electrode.

11. A pressure sensor comprising:
a common electrode formed as a layer;
a plurality of individual electrodes arranged in a matrix opposing the common electrode;
a plurality of thin-film transistors respectively located corresponding to the individual electrodes on sides of the individual electrodes opposite to the common electrode, where one or two or more adjacent thin-film transistors are connected to one individual electrode;
a common pressure-sensitive layer disposed on a surface of the common electrode on a side facing the plurality of individual electrodes;
a first individual pressure-sensitive layer disposed on a surface of a first electrode among the plurality of individual electrodes on a side facing the common electrode; and
a second individual pressure-sensitive layer disposed on a surface of a second electrode among the plurality of individual electrodes on a side facing the common electrode,
with a gap between the second individual pressure-sensitive layer and the common electrode shorter than a gap between the first individual pressure-sensitive layer and the common electrode.

12. The pressure sensor according to claim 11, wherein the second electrode is thicker than the first electrode.

13. The pressure sensor according to claim 11, wherein the second individual pressure-sensitive layer is thicker than the first individual pressure-sensitive layer.

14. The pressure sensor according to claim 11, further including
a region subject to pressing where the first individual pressure-sensitive layer and the second individual pressure-sensitive layer are arranged in a row so as to be within a minimum pressing force area, regardless of which position of the region is pressed.

15. The pressure sensor according to claim 11, further comprising
a spacer formed on a surface of the common pressure-sensitive layer on a side that faces the first individual pressure-sensitive layer and the second individual pressure-sensitive layer to oppose the first individual pressure-sensitive layer and the second individual pressure-sensitive layer.

16. The pressure sensor according to claim 11, further comprising
spacers formed on surfaces of the first individual pressure-sensitive layer and the second individual pressure-sensitive layer on sides that face the common pressure-sensitive layer to oppose the common pressure-sensitive layer.

* * * * *